(12) United States Patent
Bolkhovitin et al.

(10) Patent No.: US 10,474,528 B2
(45) Date of Patent: Nov. 12, 2019

(54) REDUNDANCY CODING STRIPE BASED ON COORDINATED INTERNAL ADDRESS SCHEME ACROSS MULTIPLE DEVICES

(71) Applicant: Western Digital Technologies, Inc., San Jose, CA (US)

(72) Inventors: Vladislav Bolkhovitin, San Jose, CA (US); Warren Fritz Kruger, Sunnyvale, CA (US); Brian W O'Krafka, Austin, TX (US); Sanjay Subbarao, Irvine, CA (US)

(73) Assignee: Western Digital Technologies, Inc., San Jose, CA (US)

(*) Notice: Subject to any disclaimer, the term of this patent is extended or adjusted under 35 U.S.C. 154(b) by 117 days.

(21) Appl. No.: 15/722,666

(22) Filed: Oct. 2, 2017

(65) Prior Publication Data

US 2019/0102249 A1 Apr. 4, 2019

(51) Int. Cl.
| | |
|---|---|
| *G06F 11/10* | (2006.01) |
| *G06F 3/06* | (2006.01) |
| *G06F 12/02* | (2006.01) |
| *G06F 12/10* | (2016.01) |
| *G06F 12/1009* | (2016.01) |
| *G11C 29/52* | (2006.01) |

(52) U.S. Cl.
CPC .......... *G06F 11/1068* (2013.01); *G06F 3/065* (2013.01); *G06F 3/0619* (2013.01); *G06F 3/0655* (2013.01); *G06F 3/0688* (2013.01); *G06F 11/1076* (2013.01); *G06F 12/0246* (2013.01); *G06F 12/10* (2013.01); *G06F 12/1009* (2013.01); *G11C 29/52* (2013.01); *G06F 2212/657* (2013.01); *G06F 2212/7201* (2013.01)

(58) Field of Classification Search
CPC .. G06F 11/1068; G06F 3/065; G06F 12/1009; G06F 12/10; G06F 3/0619; G06F 12/0246; G06F 3/0655; G06F 3/0688; G06F 2212/7201; G06F 2212/657; G11C 29/52
USPC ........................................................ 714/764
See application file for complete search history.

(56) References Cited

U.S. PATENT DOCUMENTS

| | | |
|---|---|---|
| 5,530,948 A | 6/1996 | Islam |
| 7,680,837 B2 | 3/2010 | Yamato |
| 7,934,055 B2 | 4/2011 | Flynn et al. |

(Continued)

OTHER PUBLICATIONS

Zhang, Jiacheng, et al., "ParaFS: A Log-Structured File System to Exploit the Internal Parallelism of Flash Devices," 2016 USENIX Annual Technical Conference, Jun. 22-24, 2016, 15 pages.

(Continued)

*Primary Examiner* — James C Kerveros
(74) *Attorney, Agent, or Firm* — Patent Law Works LLP

(57) ABSTRACT

A system and method pertains to operating non-volatile memory systems. Technology disclosed herein efficiently uses memory available in non-volatile storage devices in a non-volatile memory system. In some aspects, non-volatile storage devices enforce a redundancy coding stripe across the non-volatile storage devices formed from chunks of data having internal addresses assigned in a coordinated scheme across the storage devices. In some aspects, non-volatile storage devices enforce a redundancy coding stripe across the non-volatile storage devices at the same internal addresses in the respective non-volatile storage devices.

25 Claims, 14 Drawing Sheets

(56) References Cited

U.S. PATENT DOCUMENTS

| | | |
|---|---|---|
| 8,473,648 B2 | 6/2013 | Chakhaiyar et al. |
| 8,583,853 B1 | 11/2013 | Lee et al. |
| 9,009,565 B1* | 4/2015 | Northcott ............... G11C 29/42 365/185.09 |
| 9,118,698 B1 | 8/2015 | Radovanovic |
| 9,448,924 B2 | 9/2016 | Sundaram et al. |
| 9,720,596 B1* | 8/2017 | Bono ................... G06F 3/0608 |
| 2008/0034153 A1 | 2/2008 | Lee et al. |
| 2009/0150605 A1 | 6/2009 | Flynn et al. |
| 2012/0284460 A1 | 11/2012 | Guda |
| 2013/0046949 A1 | 2/2013 | Colgrove et al. |
| 2014/0101369 A1 | 4/2014 | Tomlin et al. |
| 2014/0365719 A1 | 12/2014 | Kuzmin et al. |
| 2015/0067244 A1 | 3/2015 | Kruger |
| 2015/0089282 A1 | 3/2015 | Taranta, II |
| 2016/0054920 A1* | 2/2016 | Patterson, III ........ G06F 3/0604 714/766 |
| 2016/0070652 A1 | 3/2016 | Sundararaman et al. |
| 2016/0320989 A1* | 11/2016 | Bromberg ........... G06F 13/1684 |
| 2016/0357461 A1* | 12/2016 | Tsao ..................... G06F 3/0619 |
| 2016/0371145 A1* | 12/2016 | Akutsu ................ G06F 3/0619 |
| 2018/0054217 A1 | 2/2018 | Schwaderer |

OTHER PUBLICATIONS

International Search Report and Written Opinion of International Application No. PCT/US2018/052369, dated Dec. 10, 2018, p. 1-13.
International Search Report and Written Opinion of International Application No. PCT/US2018/052376, dated Dec. 10, 2018, p. 1-13.
U.S. Appl. No. 15/722,685, filed Oct. 2, 2017 by O'Krafka et al.

* cited by examiner

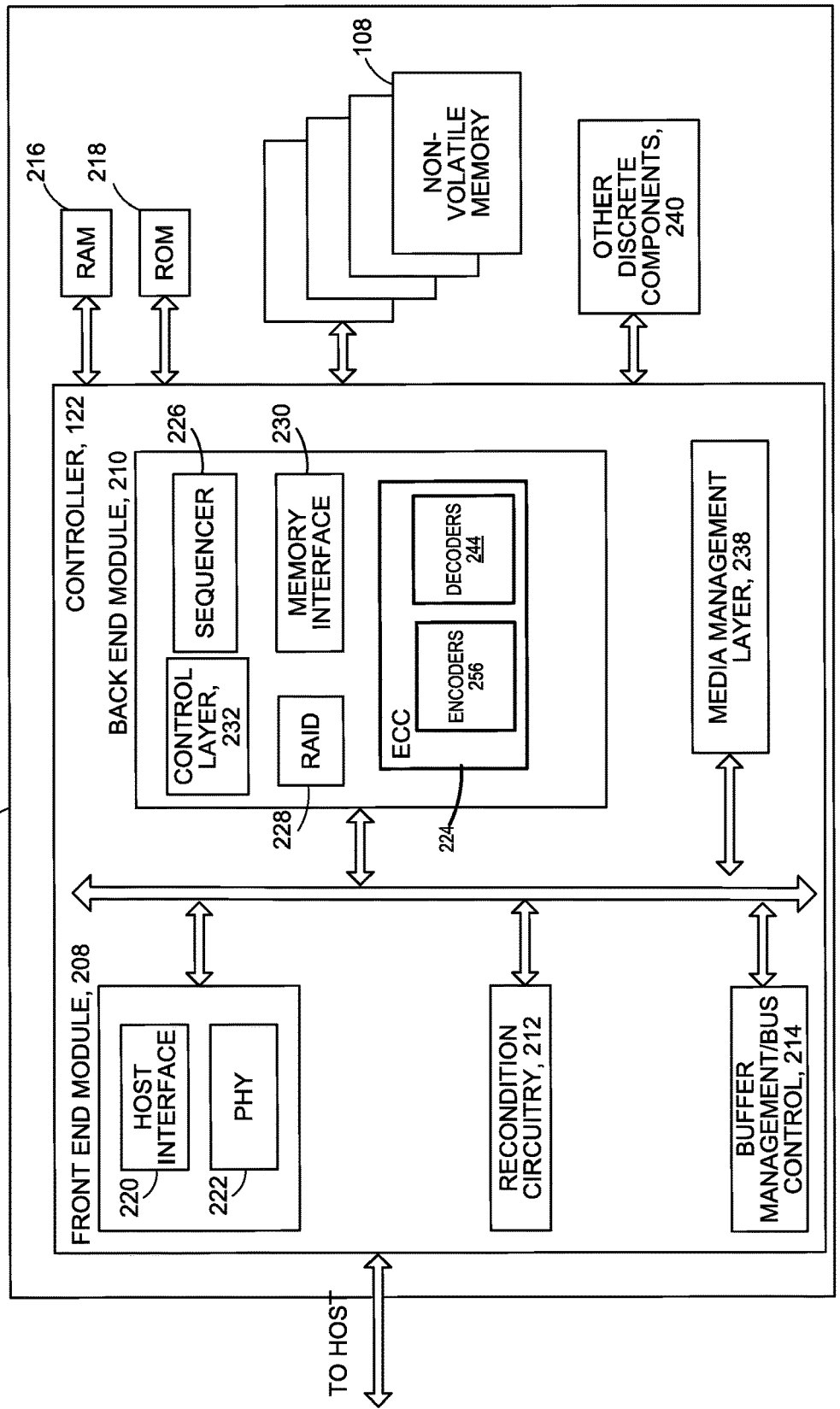

REDUNDANCY CODING STRIPE BASED ON COORDINATED INTERNAL ADDRESS SCHEME ACROSS MULTIPLE DEVICES

BACKGROUND

The present technology relates to non-volatile memory systems.

Semiconductor memory devices have become more popular for use in various electronic devices. For example, non-volatile semiconductor memory is used in cellular telephones, digital cameras, personal digital assistants, mobile computing devices, non-mobile computing devices, solid state drives, and other devices.

A charge-storing material such as a conductive floating gate or a non-conductive charge-trapping material can be used in some types of memory cells to store a charge which represents a data state. The memory cell may be a transistor in which the charge-storing material may reside between a channel and a control gate. The charge-storing material may be insulated from both the channel and the control gate. The charge-storing material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Some types of memory cells may be programmed by altering the charge in the charge-storing material, thereby altering the threshold voltage (Vth) of the memory cell transistor. In one technique, a program voltage is applied to the control gate with a low voltage in the channel to add charge to the charge-storing material. After applying the program voltage, the memory cell's threshold voltage is tested by applying a verify voltage to the control gate, and testing whether the memory cell conducts a significant current. Additional program voltages may be applied to control gate, followed by verify voltages, until the memory cell's threshold current is within a target range.

Other types of memory cells can be programmed to different resistance levels. For example, resistive random access memory (ReRAM) can be reversibly switched between a high resistance state and a low resistance data state. In some memory cells, a ReRAM cell can be reversibly switched between more than two different resistance states. Each resistance state can correspond to a range of resistances.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 2B is a block diagram of the example storage device, depicting additional details of a controller 122 of FIG. 2A.

Figure 1A:
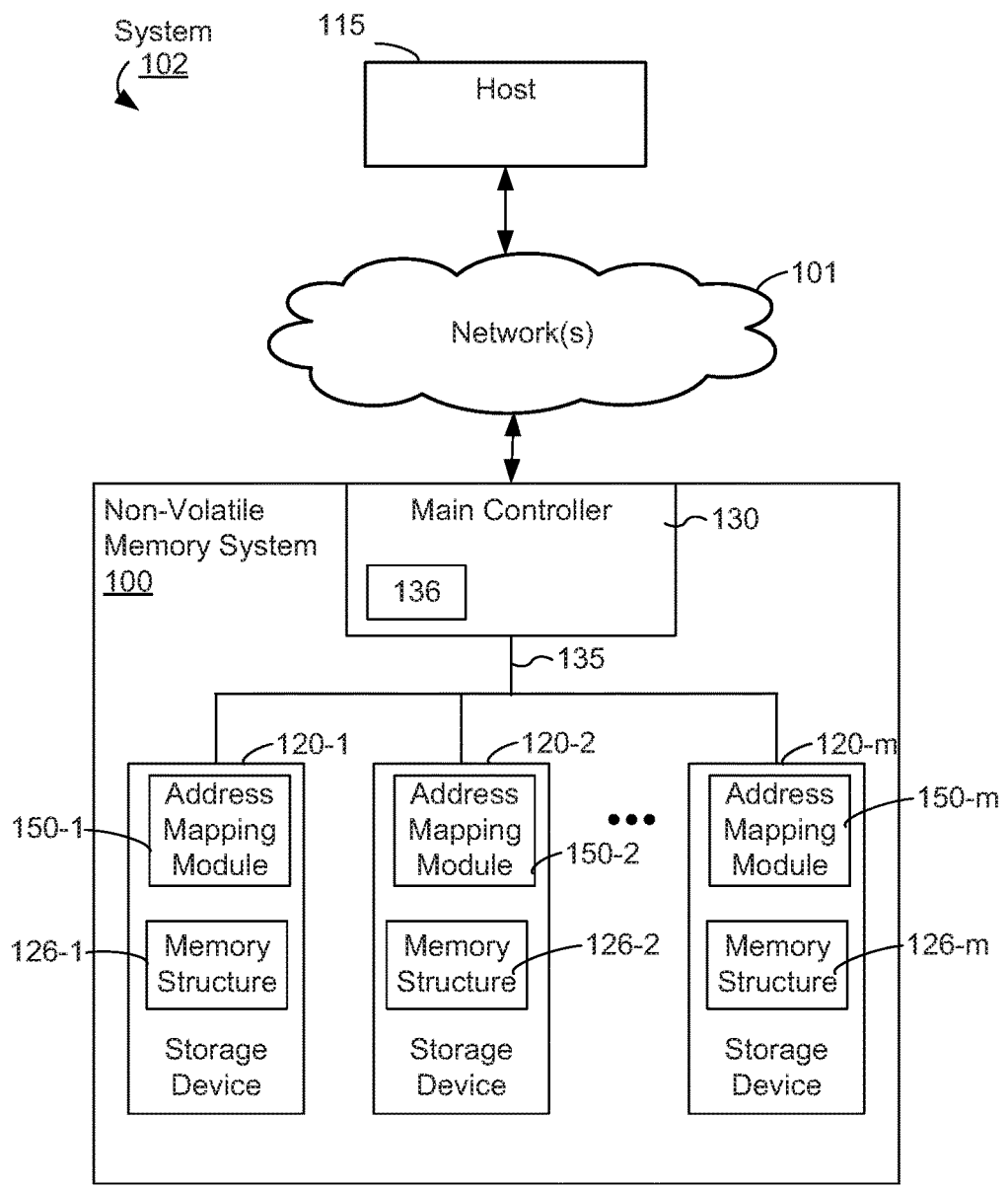
FIG. 1A is a block diagram illustrating a distributed computing system that includes a non-volatile memory system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The present technology pertains to operating non-volatile memory systems. Technology disclosed herein efficiently uses memory available in non-volatile storage devices in a non-volatile memory system. In some embodiments, a redundancy coding stripe is enforced across a non-volatile storage devices at the same internal addresses in the respective non-volatile storage devices.

Herein, a "physical address" is a hardware address (which is typically within a non-volatile storage device). Thus, a physical address is an address of a physical location. The term "logical address," as used herein, is a pointer to a physical address. Herein, an "internal logical address" is a logical address in an address space of a non-volatile storage device that stores data associated with the logical address. The term "external logical address," as used herein, is a logical address in an address space external to a non-volatile storage device that stores the data associated with the external logical address. As one example, the external logical address could be an address in an address space of a host that requests that data associated with the external logical address be stored in the non-volatile storage device. Herein, an "internal address" is an address in an address space of a non-volatile storage device. Two examples of internal addresses are internal logical addresses and physical addresses.

Herein, "random writes" refers to a sequence of writes that do not have sequential addresses. For example, a host may issue a sequence of write commands in which the logical addresses are scattered. A sequence of random writes may thus comprise random external logical addresses. In contrast, "sequential writes," as the term is used herein, refers to a sequence of writes that do have sequential addresses. For example, a host may issue a sequence of write commands in which the logical addresses are ordered sequentially.

In some embodiments, non-volatile storage may be used to store data using redundant data-based protection schemes, sometimes called redundancy coding. One example of redundancy coding is commonly referred to as RAID (redundant array of independent disks). Numerous types or levels of redundancy coding and RAID are well known, and the present disclosure does not presume to fully describe all types or levels of Redundancy Coding and RAID.

In one embodiment, a non-volatile storage system has redundancy coding logic configured to compose redundancy coding stripes from chunks of data on non-volatile storage devices. The redundancy coding stripes may be RAID stripes, but are not required to be RAID stripes. In one embodiment, each of the redundancy coding stripes is formed from chunks of data having internal addresses assigned in a coordinated scheme across the non-volatile storage devices. In one embodiment, the scheme coordinates (between non-volatile storage devices) how external logical addresses are translated to internal addresses. The address translation coordination can be performed in a variety of ways.

In one embodiment, to compose a redundancy coding stripe from chunks of data having internal addresses assigned in a coordinated address translation scheme, the redundancy coding stripe is formed from data having the same internal address on each of the non-volatile storage devices. The internal addresses could be internal logical addresses or physical addresses. Note that this is in contrast to forming a redundancy coding stripe from chunks that have the same external logical address on different non-volatile storage devices.

In one embodiment, to compose a redundancy coding stripe from chunks of data having internal addresses assigned in a coordinated address translation scheme, the redundancy coding stripe is formed from chunks of data having the internal addresses assigned according to a fixed translation scheme. The term "fixed translation scheme," as defined herein, means an address translation scheme in which an address of a chunk of data on a particular storage device is defined as a fixed or pre-defined mathematical relationship.

In one embodiment, to compose a redundancy coding stripe from chunks of data having internal addresses assigned in a coordinated address translation scheme, the redundancy coding stripe is formed from chunks of data having the internal addresses assigned according to one or more translation lookup tables incorporating the fixed or pre-defined mathematical relationship inside of each of the plurality of non-volatile storage devices.

Some memory systems, comprising multiple non-volatile storage devices, employ a log structured type of organization for storing data in non-volatile storage. A log-structured organization may convert write data from a host that have "temporal locality" (i.e., are performed close together in time) to a layout that has "spatial locality" on the non-volatile storage, even though the data may not be spatially local in the host address space. For example, random writes from the host may be written to the non-volatile storage sequentially in terms of physical location. Such a log structured type of organization may increase the performance of the non-volatile storage. For example, write amplification may be reduced.

One possible way to implement a log structured organization in a system with multiple non-volatile storage devices is for logic external to the non-volatile storage device within the system (e.g., solid state drive) to maintain a table that maps from one address space (e.g., virtual address space) to another address space (e.g., external logical address space). As an example, random writes in the virtual address space that occur at about the some point in time may be mapped to a sequence in the external logical address space. For the sake of discussion, the addresses will be referred to as "block addresses." Thus, the table may map virtual block addresses (VBAs) in the virtual address space to external logical block addresses (external LBAs) in the external logical address space. Such a mapping table may be referred to herein as a "write-serialization" mapping table.

One or more write commands may be sent to the non-volatile storage to write data at the sequence of external LBAs. Some non-volatile storage devices may map between the external LBA to an internal address, which may define a physical location in the non-volatile storage device. For example, the non-volatile storage device may have a data structure (e.g., logical to physical translation table) that maps external LBAs to physical block addresses (PBAs) in the non-volatile storage device. Note that some non-volatile storage devices may have an additional "internal logical address" (internal LBA) between the external LBA and the PBA. Thus, some non-volatile storage devices may map from an external LBA to an internal LBA, and also map from the internal LBA to a PBA.

However, in the system environment with multiple storage devices providing a large aggregate storage capacity, such a log structured type of organization may require a large crash-safe mapping table to map from the virtual address space to the external logical address space. For example, a large crash-safe mapping table may be needed to map from VBAs to external LBAs. Storing such a table in the non-volatile storage memory cells of the non-volatile storage device may negatively impact performance of the non-volatile storage device. One possible option is to store the mapping table in dynamic RAM (DRAM). However, given the size of the table, the cost of the DRAM could be considerable. For example, the table might need five bytes per 4 k page of storage. For example, for 1 PB of storage the table may require >1 TB of DRAM.

Additionally, the VBA to external LBA mapping may require garbage collection and/or data compaction. However, garbage collection may be resource intensive. For example, garbage collection can consume multiple CPU cores and many GBs of memory. Data compaction performs data movements via reading and then writing data blocks, hence all write amplification becomes fully visible on the data bus. Finally, parity computation additionally puts significant load on multiple CPU cores, memory bandwidth and CPU caches (via trashing them). Especially the memory bandwidth overhead is significant, because usually it is the most scarce system resource for storage applications.

Embodiments disclosed herein leverage internal capabilities of non-volatile storage devices to implement efficient logic structuring in a storage system environment. In one embodiment, logical to physical mapping tables in non-volatile storage devices are exploited to offload a host-based or storage system controller-based write-serialization mapping table. This significantly reduces the large memory requirement at the system/host level. By leveraging storage device-supported optimizations, the host software or the storage system controller could be simpler and more resources can be freed to perform compute tasks, providing significantly more performance at less cost. The entire system becomes more scalable, as the performance of write serialization mapping could be scaled linearly with the number of storage devices.

Certain embodiments of the invention can provide advantages in NVMe Over Fabric (NVMeOF) storage platforms (e.g., NVMeOF Intelligent Platform), because NVMeOF allows building of highly efficient NVMeOF controllers, which can perform tens of millions IOPS in silicone. In this context, a storage controller, however, cannot perform RAID-related tasks without significant loss of efficiency, hence becoming a single bottleneck. Offloading redundancy tasks to the storage devices would allow adding RAID/erasure coding functionality into NVMeOF storage platforms without significant loss of performance scalability. As result, it would be possible to build highly efficient NVMeOF storage platforms, which can withstand, for instance, two drive failures with just 10% storage overhead (20+2 RAID), while having performance of 10M IOPS or more on small blocks random writes with very limited cost increment, as compared to direct attached storage (DAS) storage devices of the same aggregate capacity and performance.

In one embodiment, a non-volatile storage device has mapping logic configured to map external LBAs in write requests that are received sequentially in time to sequential addresses in an internal address space of the non-volatile storage device. The mapping logic may be configured to store the mapping in the non-transitory storage. As one example, the mapping logic could store a logical to physical translation table in non-transitory storage. In one embodiment, mapping logic of a given non-volatile storage device is configured to map random external logical addresses in write requests that are received sequentially in time at the given non-volatile storage device to physically contiguous locations in the given non-volatile storage device. In one embodiment, mapping logic of a given non-volatile storage device is configured to map random external logical addresses in write requests that are received sequentially in time at the given non-volatile storage device to sequential internal addresses of the given non-volatile storage device.

FIG. 1A is a block diagram illustrating a distributed system 102 that includes an implementation of a non-volatile memory system 100, coupled over a network 101 to a host system 115 (sometimes called host computer system, host device, or host) in accordance with some embodiments. Note that there may be more than one host system 115 connected to the non-volatile memory system 100. Non-volatile memory system 100 includes non-volatile storage devices 120-1 to 120-*m* (also sometimes called an information storage device, or a data storage device, or a memory device).

In some embodiments, storage devices 120 include any number (i.e., one or more) of memory devices including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Storage devices 120 include a memory structure 126. In one embodiment, the memory structure 126 contains flash memory cells (e.g., NAND or NOR). However, the memory structure 126 is not limited to flash memory cells. Other examples for memory structure 126 include resistive random access memory ("ReRAM"), ferroelectric random access memory ("FRAM"), and magnetoresistive random access memory ("MRAM").

The memory structure 126 can be two-dimensional (2D) or three-dimensional (3D). The memory structure may comprise one or more arrays of memory cells. The memory structure may comprise a monolithic 3D memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

In FIG. 1A, host system 115 is coupled to a main storage controller 130 of non-volatile storage system 100 through network 101. However, in some embodiments host system 115 includes a storage controller, or a portion of main storage controller 130, as a component and/or as a subsystem. For example, in some embodiments, some or all of the functionality of storage controller 130 is implemented by software or hardware within host system 115. Within the illustrative non-volatile memory system 100, a main controller 130 is coupled to network 101 and to one or more storage devices 120 through connections 135. Main controller 130 is a controller for controlling access to storage devices 120 and bi-directional processing of read and write commands and associated data between networked host system 115 and storage devices 120, such as solid state disk drives (SSDs). The controller 130 may be a non-volatile memory express (NVMe) controller, a Redundancy Coding controller (e.g., a redundant array of independent disks (RAID) controller), or another type of CPU or processor for controlling access to non-volatile storage devices. In some embodiments, however, controller 130 and storage devices 120 are included in the same device (i.e., an integrated device) as components thereof. Furthermore, in some embodiments, storage devices 120 are embedded in a host device (e.g., computer system 115), such as a mobile device, tablet, other computer or computer controlled device, and the methods described herein are performed, at least in part, by the embedded storage controller.

In FIG. 1A, the main controller 130 includes a redundancy coding module 136. However, redundancy coding module 136 could be located in one of the storage devices 120 or host 115. The redundancy coding module 136 may be configured to compose redundancy coding stripes. In one embodiment, each of the redundancy coding stripes is formed from a chunk of data on each of the non-volatile storage devices 120. In one embodiment, each of the redundancy coding stripes is formed from data having internal addresses assigned in a coordinated scheme across the storage devices 120. In one embodiment, each of the redundancy coding stripes is formed from data having the same internal address in the non-volatile storage devices 120. In one embodiment, each of the redundancy coding stripes is formed from chunks of data having the internal addresses assigned according to a fixed translation scheme. In one embodiment, each of the redundancy coding stripes is formed from chunks of data having the internal addresses assigned according to one or more translation lookup tables incorporating the fixed or pre-defined mathematical relationship inside of each of the plurality of non-volatile storage devices.

Host computer system 115 may be any suitable computer device, such as a computer, a laptop computer, a tablet device, a netbook, an internet kiosk, a personal digital assistant, a mobile phone, a smart phone, a gaming device, a computer server, or any other computing device. In some embodiments, host system 115 is a server system, such as a server system in a data center. In some embodiments, a host system 115 includes one or more processors, one or more types of memory, a display and/or other user interface components such as a keyboard, a touch-screen display, a mouse, a track-pad, a digital camera, and/or any number of supplemental I/O devices to add functionality to host computer system 115. In some embodiments, host computer system 115 does not have a display and other user interface components.

The storage devices 120 each include a memory structure 126 and an address mapping module 150. The address mapping module 150 may be configured to translate (or map) an address from an address space of the host 115 or an address space maintained by the main controller 130 at the system level (an external address space, as it is external to the storage device) to an internal address space of the storage device 120. The address mapping module may also be configured to store the mapping in non-transitory storage. In one embodiment, the non-transitory storage is DRAM. As one example, the address mapping module 150 could include an external logical address to physical address translation table, which may map from an external logical address provided by the main controller 130 to a physical address of the storage device 120. In one embodiment, the mapping module 150 maps from an external logical address to an internal logical address, as well as from the internal logical address to a physical address. Thus, the external logical address may be mapped to the physical address, via the internal logical address. In one embodiment, the main controller 130 translates an address space used by the host 115 (virtual block addresses) to the external logical address space the controller 130 provides to the individual storage devices 120. In certain embodiments where the host communicates with the storage devices 120 without a main controller, the translation of virtual block address to external logical address can be performed by the host.

Figure 1B:
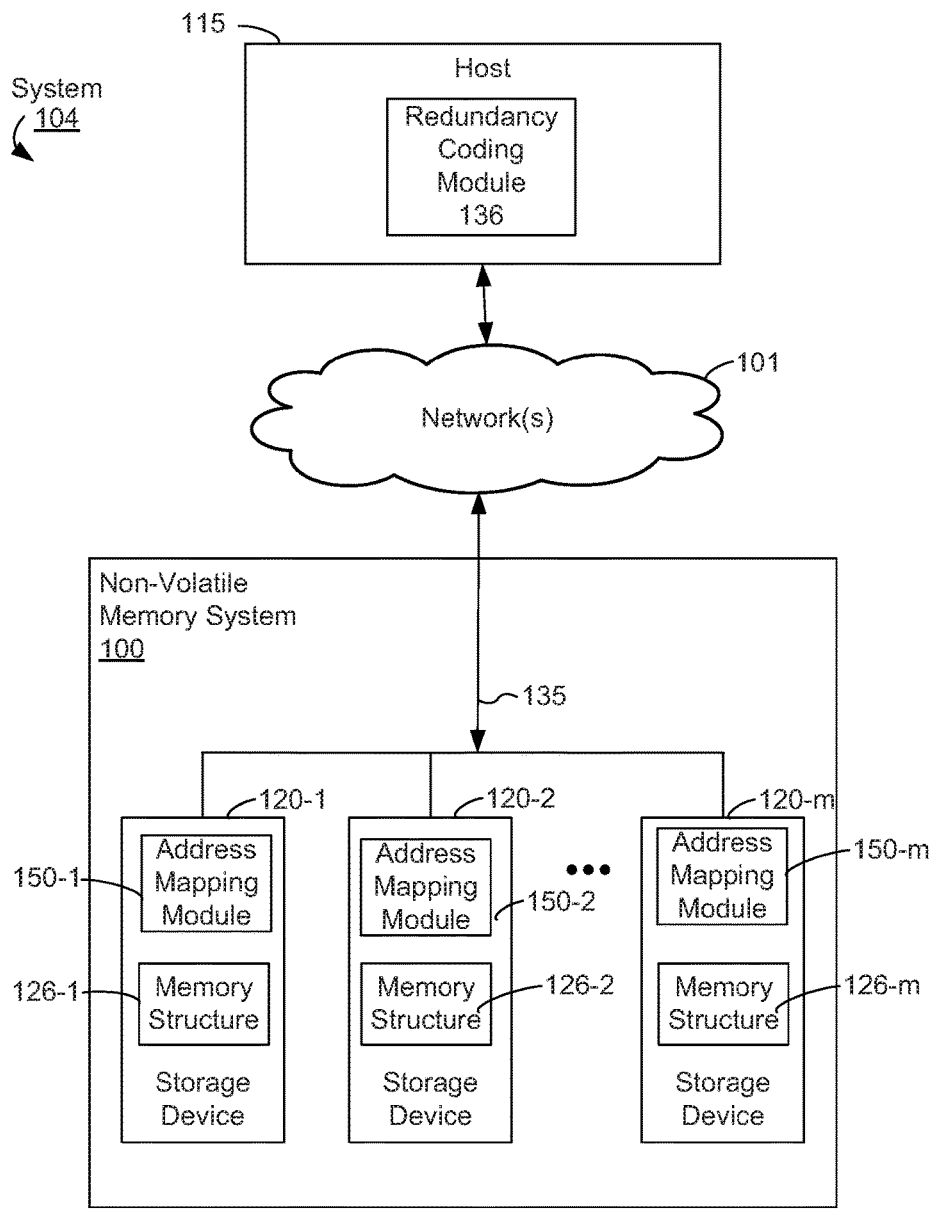
FIG. 1B is a block diagram illustrating a distributed computing system that includes one or non-volatile storage devices, in accordance with some embodiments.

FIG. 1B depicts another example system 104 in which embodiments may be practiced. In FIG. 1B, host system 115 is in communication with the storage devices 120 thorough network(s) 101 and connections 135. Network 101 and connections 135 are sometimes called data connections, but typically convey commands in addition to data, and optionally convey metadata, error correction information and/or other information in addition to data values to be stored in storage devices 120 and data values read from storage devices 120. In FIG. 1B, the host system 115 includes a redundancy coding module 136. However, redundancy coding module 136 could be located in one of the storage devices 120.

Figure 2A:
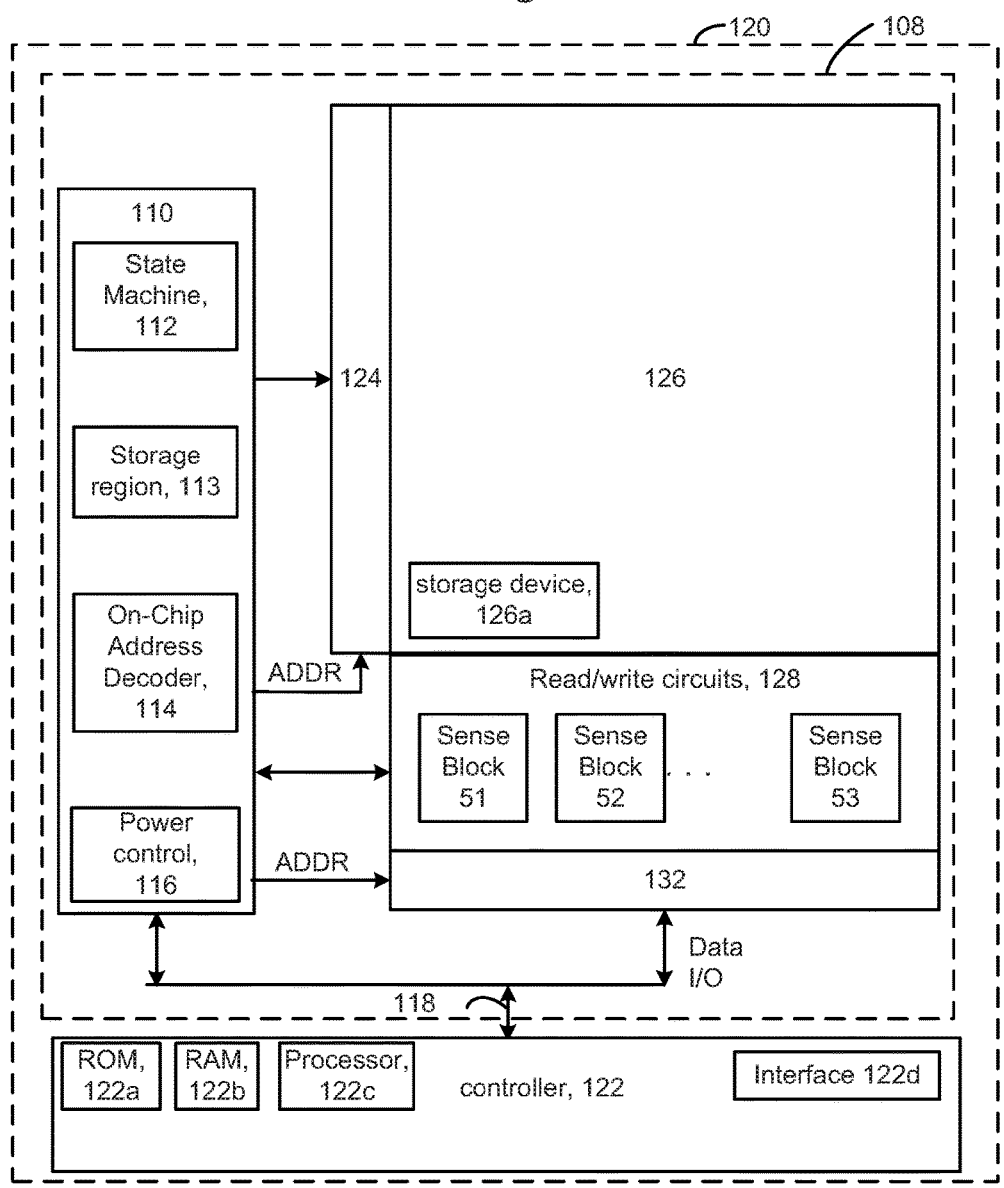
FIG. 2A is a block diagram of an example storage device in which embodiments may be practiced.

FIG. 2A is a block diagram of an example storage device 120 in which embodiments may be practiced. The storage device 120 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory system 100 (e.g., a removable storage card) as the one or more memory die 108. The controller may be separate from the memory die. Commands and data are transferred between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to word lines, select gate lines, bit lines and source lines during embodiments of memory operations. It can include drivers for word lines, SGS and SGD transistors and source lines. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth. The control circuit may also be referred to as a managing circuit.

The off-chip controller 122 (which in one embodiment is an electrical circuit) may comprise a processor 122c, storage devices (memory) such as ROM 122a and RAM 122b. In some embodiments, the RAM 122b is used to store one or more address mapping data structures (such as, but not limited to, an address mapping table). In general, an address mapping data structure maps between two addresses. In one embodiment, an address mapping data structure maps between an external logical address and an internal logical address. In one embodiment, an address mapping structure maps between an internal logical address and a physical address. Examples of address mapping data structures include, but are not limited to, address translation tables, B-trees, and log-structured merge trees.

In some embodiments, storage device area 126a is used to persist a copy of an address mapping data structure. Note that the persisted copy could be an address mapping data structure from this storage device 120 or another storage device 120. Thus, the persisted copy could be used in that event that another storage device 120 could not access its copy of its address mapping data structure in, for example, its RAM 122b (or another location).

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

The memory cells can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

FIG. 2B is a block diagram of the example storage device 120, depicting additional details of the controller 122. In one embodiment, the controller 122 is a flash controller. As used herein, a memory controller is a device that manages data stored in memory. A memory controller may communicate with a host, such as a computer or electronic device. Note that in the context of the various embodiments described herein, the "host" in the description of FIG. 2B may refer to a controller of a storage system, such as the main controller 130 shown in FIG. 1A. However, there may be an intermediary between the memory controller and host. A memory controller can have various functionality in addition to the specific functionality described herein. For example, the memory controller can format the memory to ensure the memory is operating properly, map out bad memory cells, and allocate spare memory cells to be substituted for future failed cells. Some part of the spare cells can be used to hold firmware to operate the memory controller and implement other features. In operation, when a host needs to read data from or write data to the memory, it will communicate with the memory controller. If the host provides a logical address to which data is to be read/written, the memory controller can convert the logical address received from the host to a physical address in the memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable interface. In one embodiment, memory system 100 may be a card based system, such as a secure digital (SD) or a micro secure digital (micro-SD) card. In an alternate embodiment, the memory system may be part of an embedded memory system. For example, the memory may be embedded within the host, such as in the form of a solid state disk (SSD) drive installed in a personal computer.

In some embodiments, the storage device 120 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2B is one example implementation that may (or may not) use the components of the controller 122 depicted in FIG. 2A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2B as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. Note that the host interface 220 is used to communicate with main controller 130, in one embodiment. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of one or more decoders 244 may be provided to the host.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A control layer 232 controls the overall operation of back end module 210.

Additional components of storage device 120 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Media Management Layer (MML) 238 may be integrated as part of the management that may handle errors and interfacing with the host, or the main controller 130. In one embodiment, MML 238 is a Flash Translation Layer (FTL), and corresponds to the address mapping module 150-1 to 150-$m$ depicted in the earlier figures. MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines). The MML 238, which corresponds to the address mapping module 150 of FIG. 1A, in one embodiment is configured to map between an external address in commands received via host interface 220 to an internal address used by the device 120. The MML 238 is configured to store one or more address mapping structure in non-transitory storage, in one embodiment. Examples of non-transitory storage include, but are not limited to, RAM 216, ROM 218, and non-volatile memory cells in the non-volatile memory die 108.

The controller 122 may interface with one or more memory dies 108. In one embodiment, the controller and multiple memory dies (together comprising the memory system 100) implement a solid state drive (SSD), which can emulate, replace or be used instead of a hard disk drive inside a host, as a network-attached storage (NAS) device, and so forth. Additionally, the SSD need not be made to work as a hard drive.

Figure 2C:
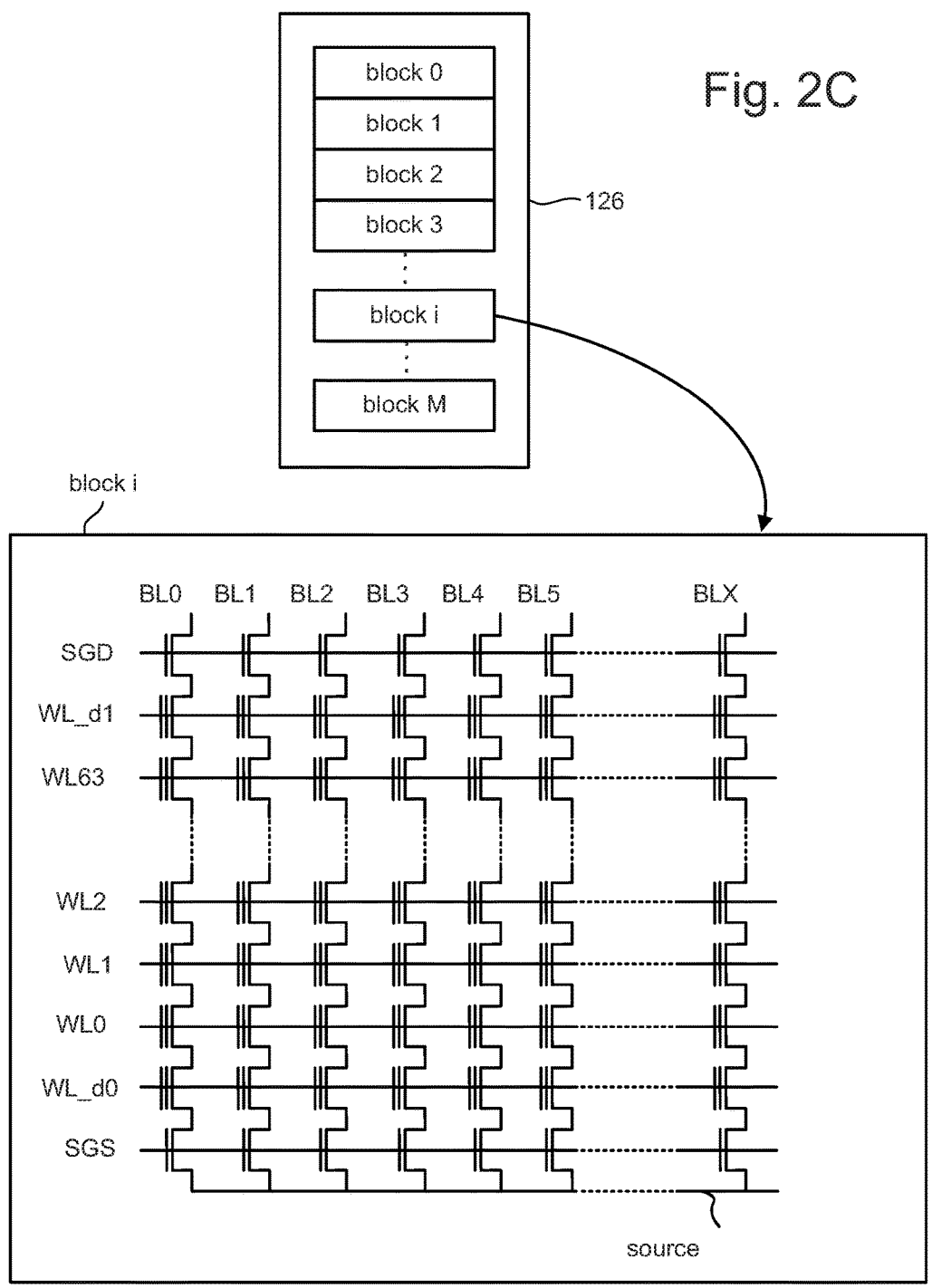
FIG. 2C depicts an exemplary structure of memory cell array.

FIG. 2C depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different pages, or even different blocks, than the user data to which they pertain. Note that the term "erase block" is used herein to refers to the minimum number of memory cells that are erased together. Thus, the blocks in FIG. 2C are one embodiment of erase blocks. An erase block may contain "data blocks." The erase block may contain "data blocks." In some embodiments, a data block is formed by one or more pages. A data block may comprise a contiguous group of memory cells.

FIG. 2C also shows more details of block i of memory array 126. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 3:
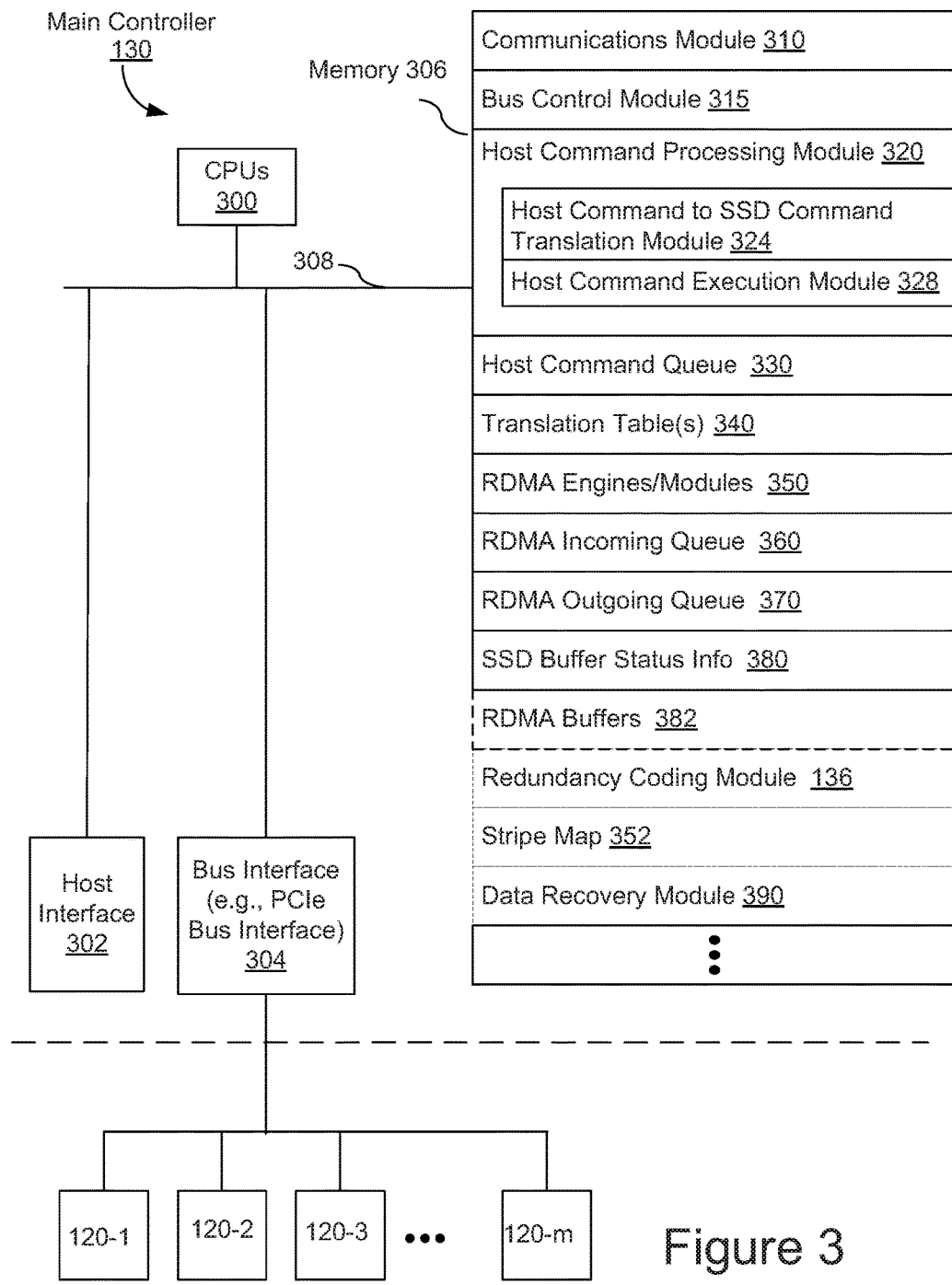
FIG. 3 is a block diagram illustrating an implementation of a main controller, in accordance with some embodiments.

FIG. 3 is a block diagram illustrating an implementation of a main controller 130, in accordance with some embodiments. In some embodiments, main controller 130 includes one or more processors 300, sometimes called CPUs, or hardware processors, or microcontrollers; host interface 302 for coupling main controller 130 to one or more host systems 115 (FIG. 1A or 1B); bus interface 304 for coupling main controller to one or more communication busses (e.g., connections 135, FIG. 1A or 1B); memory 306 (sometimes herein called controller memory); and one or more communication buses 308 for interconnecting these components. Communication buses 308 optionally include circuitry (sometimes called a chipset) that interconnects and controls communications between system components.

Main controller 130 generally facilitates getting data into and out of non-volatile memory in storage devices 120. Main controller 130 exchanges data over network 101 with host systems 115 via host interface 302. In some embodiments, main controller 130 may include a Redundancy Coding controller (e.g., a RAID controller) for storing and accessing data in an array of storage devices (e.g., storage devices 120). The one or more processors 300 execute modules, programs and/or instructions stored in memory 306 and thereby perform processing operations. In some embodiments, the one or more processors 300 are coupled to storage devices 120 by communication buses 308. In other embodiments the coupling is indirect through, for example, bus interface 304, such as a PCI Express-based bus interface (e.g., NVMe). Other bus interfaces, including a SATA or SAS bus interface may also be used.

Memory 306 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 306 optionally includes one or more storage devices remotely located from processor(s) 300. Memory 306, or alternately the non-volatile memory device(s) within memory 306, comprises a non-transitory computer readable storage medium. In some embodiments, memory 306, or the computer readable storage medium of memory 306 stores the following programs, modules, and data structures, or a subset or superset thereof: communications module 310, one or more host command queues 330; translation tables 340; RDMA engines 350; RDMA incoming queue 360 and RDMA outgoing queue 370; and/or SSD buffer status information table or data structure 380. Some of these engines/modules can be implemented in hardware circuitry and/or a combination of firmware/software and hardware circuitry.

Communications module 310 may be used for communicating with other components, such as storage devices 120, and host computer systems 115. Bus control module 315 may be used for executing bus protocols and transferring data over busses between components.

Host command processing module 320 may receive read and write commands from host system 115, allocate storage buffers in storage devices, and translate the host commands into storage device commands to facilitate remote DMA transfers of data corresponding to the read and write commands between host buffers on host systems 115 and storage buffers on associated storage devices 120. To facilitate the translation of host commands, host command processing module 320 may include a host command to SSD command translation module 324, which converts host write and read commands into commands suitable for execution by storage device 120, and optionally facilitates virtualizing addresses embedded in the host commands. Host command processing module 320 may further include a host command execution module 328 that facilitates executing received host commands, for example by setting up and executing remote DMA data transfers, and sending translated storage device commands to respective storage devices 120 for execution.

The one or more host command queues 330 may be used to track commands received from host 115 and their associated translated commands.

Translation tables 340 may be used in some embodiments to translate addresses or name spaces in the received host commands into storage device identifiers or storage device addresses.

RDMA engines 350 may be used in some embodiments to transfer data between a host buffer and one or more allocated storage buffers associated with one or more storage devices 120. The RDMA engines 350 in some embodiments use translated commands, addresses and/or buffer pointers associated with translated commands to accomplish remote direct memory access (RDMA) operations; each RDMA engine 350, once configured with pointers to host and storage device buffers and a counter or other indicator of the quantity of data to be transferred, transfers data between designated host buffers and storage buffers independently of the one or more processors 300.

RDMA incoming queue 360 and RDMA outgoing queue 370 may be used to facilitate RDMA operations. Host command processing module 320 and RDMA engines 350 may use RDMA incoming queue 350 and RDMA outgoing queue 370 to keep track of read operations and write operations that have not yet completed, in accordance with some embodiments.

SSD buffer status information table or data structure 380 may be used to facilitate the allocation of storage buffers in storage device 120, host command processing module 320 uses an SSD or storage device status information table or data structure 380 to keep track of which storage buffers have been allocated and which are available for allocation, in accordance with some embodiments.

In some embodiments, memory 306 of main controller 130 also includes one or more RDMA buffers 382, for temporarily storing data or information being transferred between a host and an SSD or storage device.

Optionally, memory 306 of main controller 130 further includes redundancy coding module 136 for determining the non-volatile storage devices 120 in which to store data and parity information for any given write command or set of write commands, for example when using a particular Redundancy Coding level (e.g., any predefined RAID level such as RAID0 to RAID6, RAID10, RAID01, and so on). In some embodiments, redundancy coding module 136 works in conjunction with a stripe map 352 or stripe function for determining the particular storage devices in which to store data and parity when performing any specified write operation or set of write operations. In some embodiments, main controller 130, when sending a parity generation command to a particular storage device 120, to generate parity data for specified data, also provides to that storage device a stripe map or other data structure so that the storage device knows which other storage device to forward the specified data to for storage.

In some embodiments, memory 306 of main controller 130 further includes a data recovery module 390, for recovering data when a storage device 120 fails or more generally when the data in a portion of a stripe cannot be read from the information stored in the storage device 120 storing that portion of the stripe.

Each of the above identified elements may be stored in one or more of the previously mentioned memory devices that together form memory 306, and corresponds to a set of instructions and data for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 306 may store a subset of the modules and data structures identified above. Furthermore, memory 306 may store additional modules and data structures not described above. In some embodiments, the programs, modules, and data structures stored in memory 306, or the computer readable storage medium of memory 306, provide instructions for implementing respective operations in the methods described below with reference to FIGS. 4, 8 and 9.

Although FIG. 3 shows a main controller 130, FIG. 3 is intended more as a functional description of the various features which may be present in a main controller, or non-volatile memory controller, than as a structural schematic of the embodiments described herein. In practice, and as recognized by those of ordinary skill in the art, items shown separately could be combined and some items could be separated. Further, as noted above, in some embodiments, one or more modules of main controller 130 are implemented by one or more modules of host computer system 115, or as part of a storage device 120.

Figure 4:
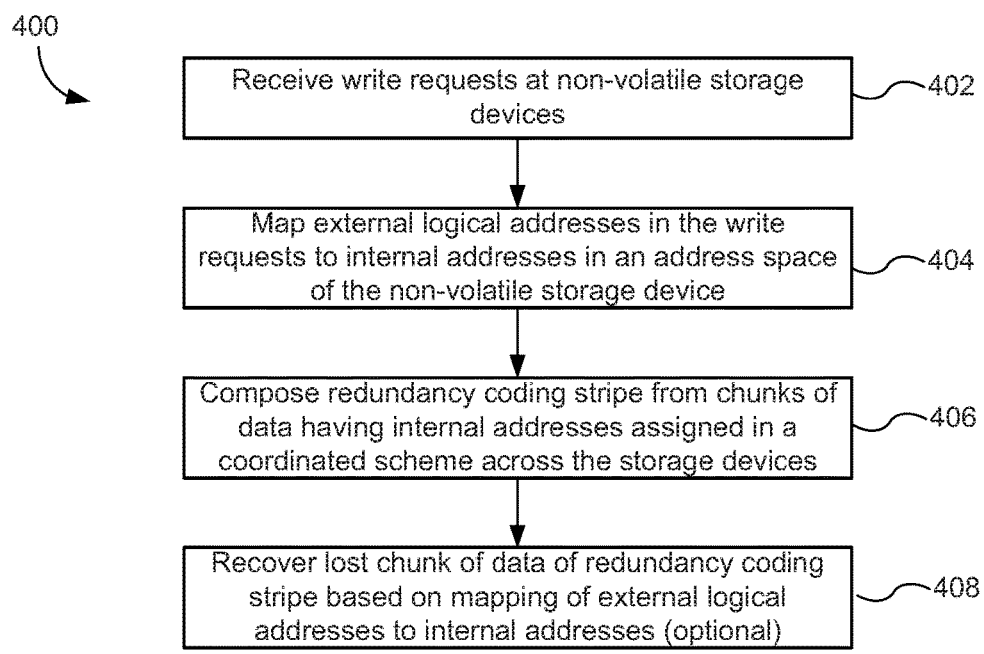
FIG. 4 is a flowchart of one embodiment of a process of operating non-volatile storage.

FIG. 4 is a flowchart of one embodiment of a process 400 of operating non-volatile storage. The process 400 may be performed in system 102 of FIG. 1A, system 104 of 1B, but is not limited thereto. Reference will be made to elements in FIGS. 1A and 1B for purposes of illustration. Note that process 400 is not limited to either system 102 or 104.

Step 402 includes receiving write requests at non-volatile storage devices 120. In one embodiment, host 115 sends the write requests to the non-volatile storage devices 120 over, for example, network 101 and/or connection 135. In one embodiment, host 115 sends the write requests to the main controller 130 over, for example, network 101. The main controller 130 may forward the write requests to the non-volatile storage devices 120 over, for example, connection 135. The main controller 130 may modify the write requests from the host prior to forwarding them to the storage devices 120. In some embodiments, the write requests contain external logical addresses that are associated with the data to be written. Herein, these logical addresses may be referred to as "external logical addresses," as they refer to an address space external to the non-volatile storage devices 120. The external logical addresses are addresses in an address space of the host 115 or main controller 130, after it has translated the addresses used by the host 115, in one embodiment. In one embodiment, the write requests are received by front end module (FIG. 2B, 208).

Figure 7:
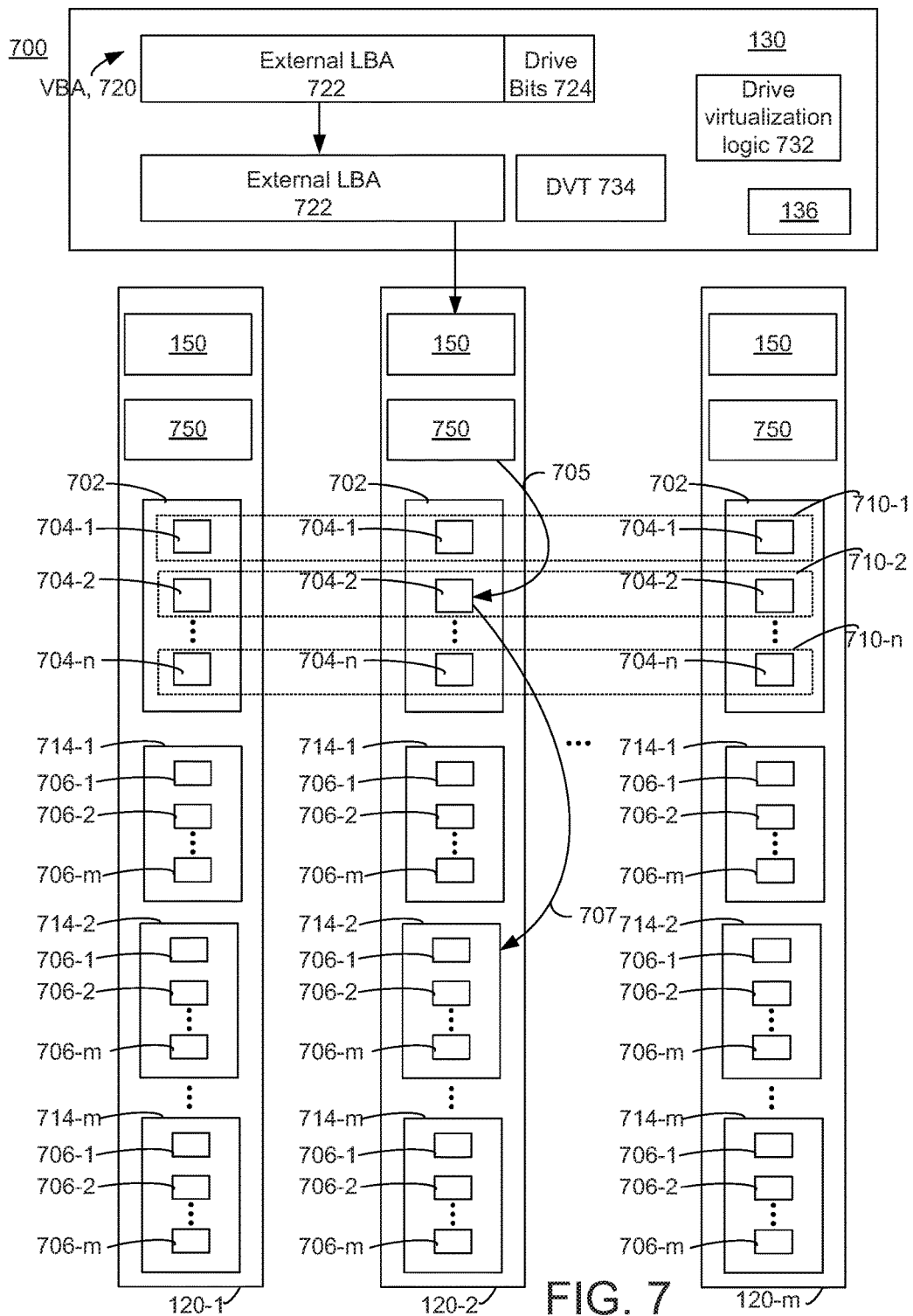
FIG. 7 depicts one embodiment of a non-volatile memory system in which embodiments may be practiced.

Step 404 includes mapping external logical addresses in the write requests to internal addresses of the non-volatile storage devices 120. Step 404 is performed within each storage device 120 by address mapping module 150, in one embodiment. The internal addresses are addresses in an internal addressing scheme of the non-volatile storage devices 120, in one embodiment. FIG. 7, to be discussed below, depicts one embodiment of an internal addressing scheme of the non-volatile storage devices 120. The internal addresses could be internal logical addresses or physical addresses. Note that the mapping module 150 performs two mappings, in one embodiment. The mapping module 150 may map from an external logical address to an internal logical address. Also, the mapping module 150 may map from the internal logical address to a physical address. Note that a non-volatile storage device 120 may, in some embodiments, move data from a first physical location to a second physical location (where the first physical location has a first physical address and the second physical location has a second physical address). In this case, the mapping module 150 may change the mapping for the internal logical address for the moved data to refer to the second physical address, instead of the first physical address.

Step 406 includes composing a redundancy coding stripe from chunks of data having internal addresses assigned in a coordinated scheme across the non-volatile storage devices 120, in one embodiment. Step 406 includes composing a redundancy coding stripe from chunks of data having the same internal address in the non-volatile storage devices 120, in one embodiment. Alternatively, step 406 includes composing a redundancy coding stripe from chunks of data having the internal address assigned according to a fixed translation scheme non-volatile storage devices 120, in one embodiment.

Figure 7A:
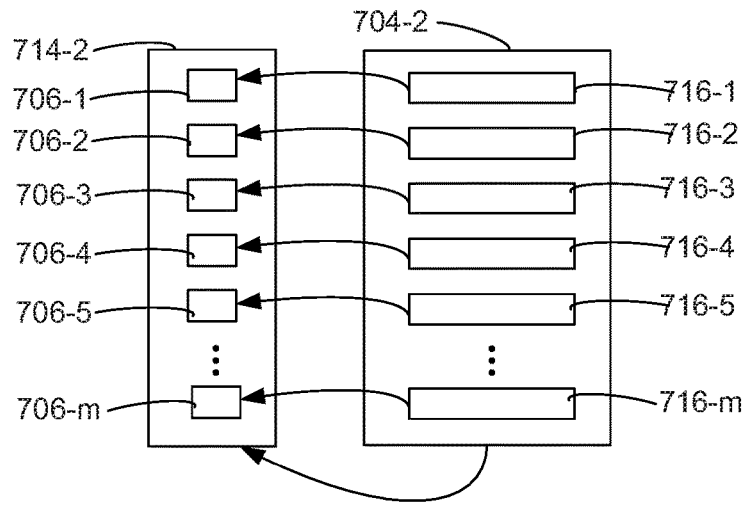
FIG. 7A depicts further details of entry 704-2 of FIG. 7.
Figure 7B:
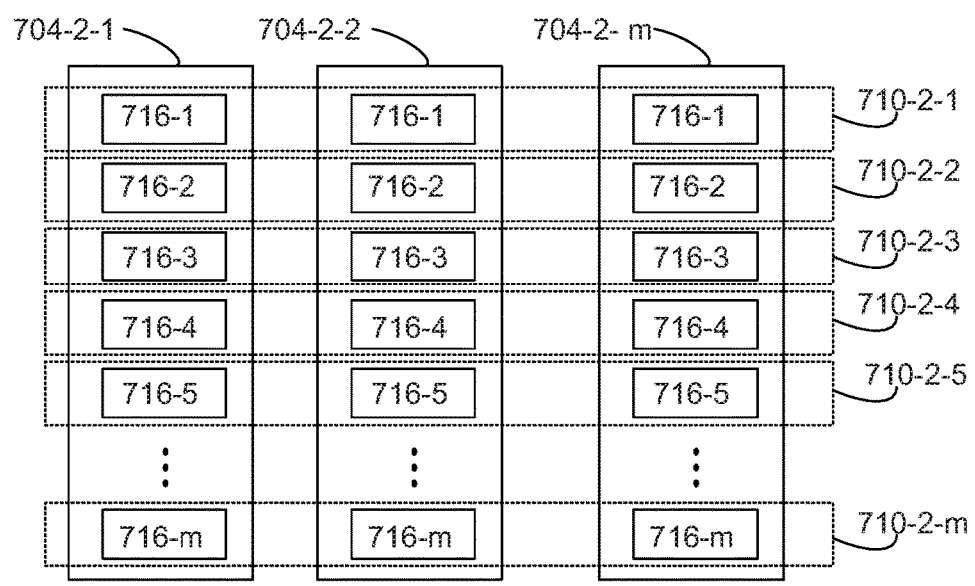
FIG. 7B depicts an example of redundancy coding stripes in which the chunk size corresponds to one data block.

The redundancy coding stripe may comprise one chunk on each of a number of non-volatile storage devices 120. FIGS. 7 and 7B, to be discussed below, shows examples of redundancy coding stripes. The internal address may be an internal logical address or a physical address (note that a physical address is a type of internal address in this example). In one embodiment, step 406 is performed by redundancy coding module 136 in main controller 130. Note that redundancy coding module 136 may be referred to as redundancy coding logic. Note that all or a portion of the main controller 130 could be integrated into one or more of the non-volatile storage devices 120. Thus, redundancy coding module 136 may be one or more of the of the non-volatile storage devices 120. In one embodiment, step 406 is performed by redundancy coding logic in host 115. The redundancy coding module 136 could be located elsewhere.

Figure 9:
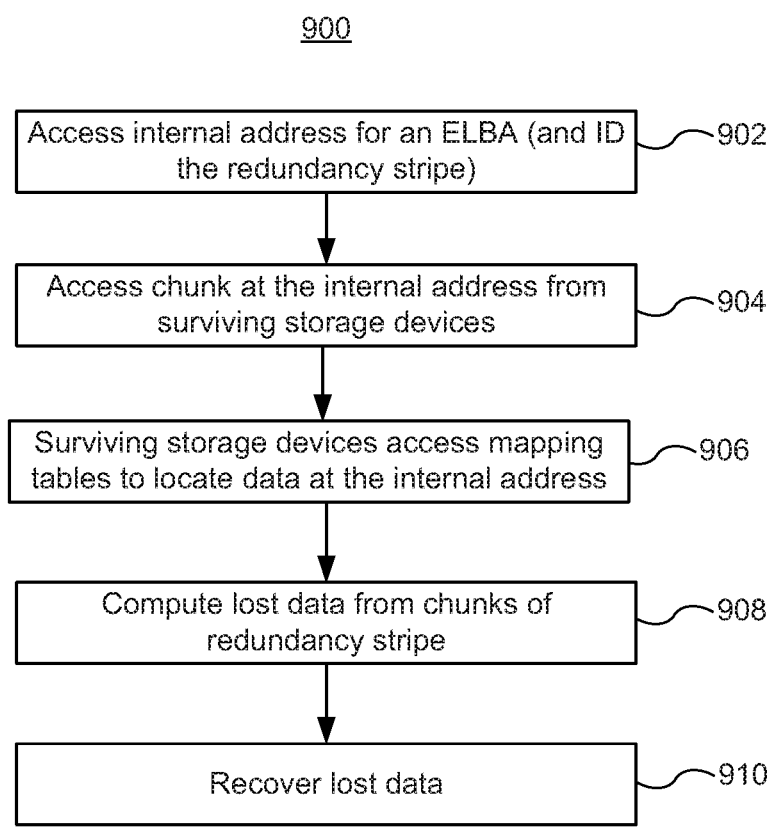
FIG. 9 is a flowchart of one embodiment of a process of recovering lost data for an ELBA using chunks in a redundancy stripe.

Step 408 includes the optional step of recovering a lost chunk of data of a redundancy stripe based on the mapping of the external logical addresses to the internal logical addresses. Note that the mapping may be stored in non-transitory storage in one or more of the non-volatile storage devices 120. Process 900 of FIG. 9 is one embodiment of step 408. In one embodiment, step 408 is performed by redundancy coding module 136 in main controller 130. In one embodiment, step 408 is performed by redundancy coding module 136 in host 115. In one embodiment, step 408 is performed by a redundancy coding module in one or more storage devices 120. The redundancy coding module 136 could be located elsewhere.

Figure 5:
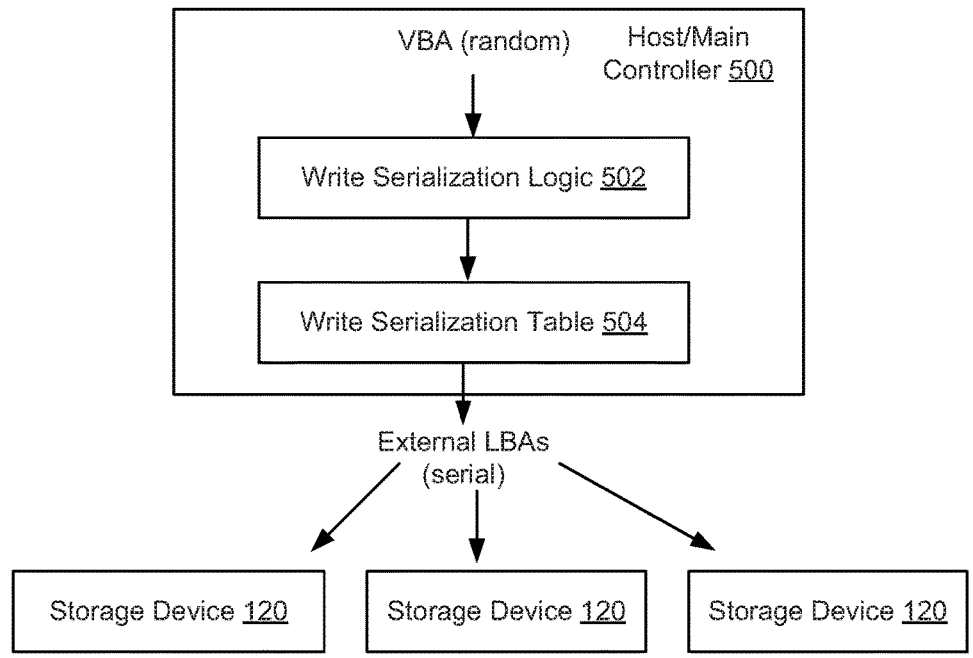
FIG. 5 depicts an example of a conventional system having a large write serialization table external to the storage device.

Some embodiments obviate the need for a large crash-safe write serialization table external to the storage devices 120 within a storage system such as storage system 100 in FIG. 1A. FIG. 5 depicts an example of a conventional system having a large write serialization table 504 external to the storage devices 120. The large write serialization table 504 could be in a host system or a main controller of a storage system coupled to a host system, for example. The host/main controller 500 has write serialization logic 502 that is configured to serialize random virtual block addresses (VBAs) into serial external logical block addresses (LBAs). Note that VBAs and LBAs are for writes to be performed in the storage devices 120. For example, VBAs that are spread randomly across a virtual address space spanning storage devices 120, but that are for writes that occur sequentially in time, may be converted to a sequence of external LBAs. The sequence of external LBAs may be sent to the storage devices 120. The write serialization logic 502 stores a mapping from the VBAs to LBAs in the write serialization table 504.

Note that the write serialization table 504 may need to be extremely large in a storage system with many storage devices. For example, a conventional write serialization table 504 may need five bytes per every 4 KB stored in the non-volatile storage devices (assuming 4 KB page sizes). For example, if the non-volatile storage devices have a capacity of 1 petabyte (PB), the write serialization table 504 may need to be over 1 terabyte (TB) in size. The cost to store the write serialization table 504 in DRAM in the host could be extremely high.

Figure 6:
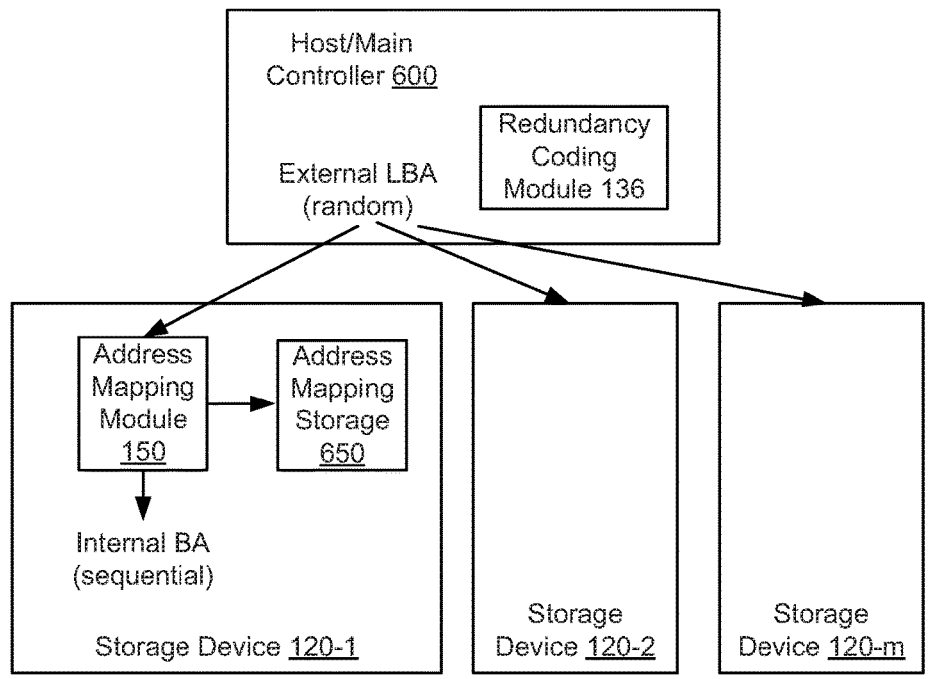
FIG. 6 is a block diagram of one embodiment of a system that obviates a need for a write serialization table external to the storage device.

Embodiments disclosed herein obviate the need to have a write serialization table 504 external to the storage devices 120. In some embodiments, the serialization is off-loaded to the storage devices 120. FIG. 6 is a block diagram of one embodiment of a system that obviates a need for a write serialization table external to the storage device 120. The host/main controller 600 sends write requests to the storage devices 120-1 to 120-m. A sequence of the write requests have external LBAs, which may be random. For example, a sequence of the external LBAs may be randomly distributed in an address space of the host (or other device).

The address mapping module 150 in a storage device 120 sequentializes the randomly distributed external LBAs, in one embodiment. In one embodiment, the mapping module 150 is configured to map random external LBAs in the write requests that are received sequentially in time to sequential internal addresses (e.g., internal block addresses (BAs)). In one embodiment, the sequential internal addresses are within the same erase block. The sequential internal addresses are physical addresses, in one embodiment. The sequential internal addresses are internal logical addresses, in one embodiment. The address mapping module 150 may be configured to store the mapping of random external LBAs to sequential internal LBAs in the address mapping storage 650. In one embodiment, the mapping module 150 is configured to map random external LBAs in the write requests that are received sequentially in time to physically contiguous locations in the storage device 120. The physically contiguous locations have a contiguous range of physical addresses, in one embodiment.

In one embodiment, the redundancy coding module 136 forms redundancy coding stripes from a chunk of data on each of the non-volatile storage devices 120-1 to 120-m. A given redundancy coding stripe is formed from chunks of data having the same internal address on different storage devices 120, in one embodiment. Note that if the redundancy coding stripe were to be formed from chunks having the same external LBA, then there may need to be a large table outside of the non-volatile storage devices that maps from a virtual address to an external logical address. For example, in the conventional system of FIG. 5, a redundancy coding stripe might be formed from chunks have the same external LBA. However, this requires the large (and expensive) write serialization table 504 outside of the storage device 120. Some embodiments provide for a much more cost-effective solution.

Also note that by each non-volatile storage device 120-1 to 120-m writing its chunk of the redundancy stripe to the same internal address, this may result in sequential data writing at the same internal address across multiple non-volatile storage devices 120-1 to 120-m, in one embodiment. For example, consider a case in which four different non-volatile storage devices 120 each store one chunk of data in the redundancy coding stripe. The host/main controller 600 may send four random external LBAs that were received sequentially in time by the host/main controller 600 to the four different non-volatile storage devices 120. Each of the four different non-volatile storage devices 120 write to the same internal address, in one embodiment. This may result in a serializing of the random external LBAs in a coordinated fashion across the non-volatile storage devices. Also note that instead of writing to the same internal address, the non-volatile storage devices could write to internal addresses assigned in a coordinated scheme across the storage devices. For example, one alternative to writing to the same internal address is to write to internal addresses assigned according to a fixed translation scheme.

FIG. 7 depicts one embodiment of a non-volatile memory system 700. The system 700 has a main storage controller 130 and a number of non-volatile storage devices 120-1 through 120-*m*. In one embodiment, the non-volatile memory system 700 obviates the need for a large write serialization table 504 external to the storage devices 120. In general, the main storage controller 130 may receive a virtual block address (VBA) 720 from, for example, a host (not depicted in FIG. 7). The VBA 720 includes an external LBA 722 and drive bits 724, in this example. The drive bits 724 are one or more bits that are in addition to the external LBA 722. As shown in the example, the bits are the least significant bits, so that the external LBA can be obtained through a simple shifting of the bits in the VBA. The main storage controller 130 may pass the external LBA to one of the storage devices 120, as will be explained more fully below. However, the drive bits do not necessarily point to one of the storage devices 120. A possible reason for this is that the main storage controller 130 may load balance writes across the storage devices 120. Another possible reason is that the main controller 130 may select storage devices to write to in order to compose redundancy stripes. Note that addresses are referred to as "block" addresses in FIG. 7 for purpose of illustration. A block may be any size. In one embodiment, the host 115 specifies the block size for write and/or read operations.

In one embodiment, the drive virtualization table (DVT) 734 contains a mapping from the VBA 720 to one of the storage devices 120. When a write to a VBA is received, the drive virtualization logic 732 may determine a storage device 120 to which the write should be sent. The drive virtualization logic 732 may create (or update) an entry in the drive virtualization data structure 734 that links the VBA to a unique identifier for the storage device 120 to which the write should be performed. In one embodiment, the drive virtualization data structure 734 includes an address mapping table that maps from VBA to address of a storage device. Note that this unique identifier is not necessarily the drive bits in the VBA. However, one option is to simply use the drive bits in the VBA to identify the storage device 120 to be written. In other embodiments, the identification of storage devices do not necessarily rely on the use of drive bits as part of the VBA.

Each storage device 120 has an address mapping module 150, external LBA (ELBA) to internal LBA (ILBA) mapping structure 750, an erase block virtualization structure 702, and a number of erase blocks 714-1 through 714-*m*. Arrow 705 represents a mapping from an external logical address to an internal logical address. Arrow 707 represents a mapping from the internal logical address to a physical address. The erase block virtualization structure 702 is not required. Thus, in one embodiment, mapping goes directly from an external logical address to a physical address.

The ELBA to ILBA mapping structure 750 could include a table, B-tree, etc. The erase block virtualization structure 702 could include a table, B-tree, etc. Such mapping structures 702, 750 may be stored in non-transitory storage within a non-volatile storage device 120. The mapping structures 702, 750 may be stored in volatile or non-volatile storage. Note that the storage devices 120 may employ a common internal addressing scheme.

In one embodiment, each erase block contains a group of non-volatile memory cells that are erased as one unit. An erase block is the smallest unit of memory cells that are erased, in one embodiment. Each of the erase blocks 714 has a number of data blocks 706-1 through 706-*m*. In one embodiment, the size of the data blocks 706 is dictated by the host 115. For example, the host 115 may specify the amount of data to be written or read for a given ELBA.

The erase block virtualization data structure 702 has entries 704-1 through 704-*n*, each of which points to one erase block 714. Each of the entries 704 has offsets. FIG. 7A depicts further details of entry 704-2, showing offsets 716-1 through 716-*m*. Each offset 716 references one of the data blocks 706-1 through 706-*m* in erase block 714-2. Note that the entry 704-2 could be made to point to a different physical erase block 714, in which case the offsets 716 will then reference the data blocks 706 in the new erase block 714.

In one embodiment, an ILBA is a specific entry and offset in the erase block virtualization data structure 702. Each of the offsets in the erase block virtualization data structure 702 may reference a specific data block 706. Each data block 706 may have a physical block address (PBA). Thus, each ILBA may reference a specific PBA. In the event that the storage device 120 moves the data in a data block 706 to another data block, the address mapping module 150 may update the mapping between the ILBA and the new PBA of the data block to which the data has been moved.

A number of redundancy coding stripes 710-1 through 710-*n* are depicted in FIG. 7. Each redundancy coding stripe 710 includes one chunk of data on each of the storage devices 120-1 through 120-*m*, in this example. In this example, each chunk corresponds to one entry 704 in the erase block virtualization data structure 702. For example, redundancy coding stripe 710-2 is defined by entry 704-2 in each of the storage devices 120-1 through 120-*m*. Note that each chunk of a given redundancy coding stripe 710 has the same internal logical address. However, note that each chunk of a given redundancy coding stripe 710 is not required to have the same physical address. For example, entry 704-2 for storage device 120-1 may point to a different physical erase block 714 than entry 704-2 for storage device 120-2.

Example mechanism(s) to ensure each chunk of a stripe has a same internal logical address within a storage device will be further described below with respect to FIG. 8. The end result is that the serialization that is typically performed at the system/host level is off-loaded to within each storage device, taking advantage of the inherent functions and data structures each storage device already does to perform its internal address mapping. The memory requirement at the system/host level is thus drastically reduced as it no longer has to fully track mapping data to support serialization of the entire system address space (e.g., VBA), as will be further explained below in FIG. 8.

Note that the size of the chunk size is not required to be equal to one physical erase block. For example, a chunk might be equal in size to one data block 706. In that case, the internal logical addresses of the respective chunks are still the same across the respective storage devices 120. FIG. 7B depicts an example of redundancy coding stripes 710 in which the chunk size corresponds to one data block 706. Redundancy coding stripes 710-2-1 through 710-2-*m* are depicted. FIG. 7B shows just a portion of the erase block virtualization data structure 702. In particular, FIG. 7B depicts a further level of granularity for one embodiment of entry 704-2 from erase block virtualization data structure 702 of FIG. 7. Recall that entry 704-2 may have offsets 716-1 through 716-*m*, as depicted in FIG. 7A. In the example of FIG. 7B, each redundancy coding stripe comprises one offset for each storage device 120. For example, redundancy coding stripe 710-2-2 comprises offsets 716-2 from each storage devices 120-1, 120-2, and 120-*m*. Note that each offset 716 may correspond to one data block 706. Hence, the chunk size corresponds to one data block 706, in this example. Further note that each chunk of a given redundancy coding stripe 710 has the same internal logical address.

Figure 7C:
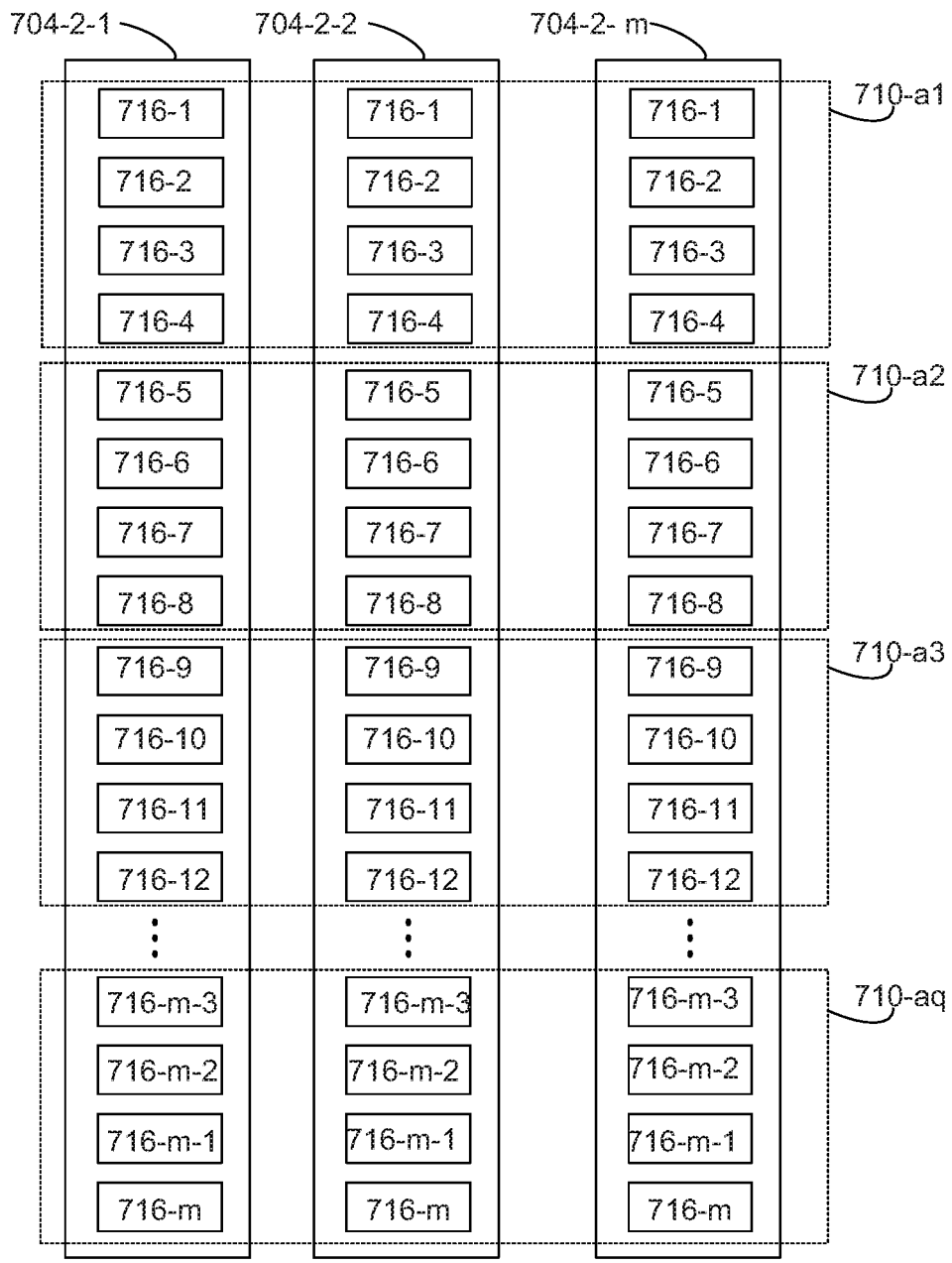
FIG. 7C depicts an example of redundancy coding stripes in which the chunk size corresponds to multiple data blocks.

As a still further example, the chunk size in a redundancy coding stripe 710 could instead be two or more data blocks 706. For example, offsets 716-1, 716-2, 716-3 and 716-4 could describe one chunk for redundancy coding stripe 710-*a*1, as depicted in FIG. 7C. In FIG. 7C, each redundancy coding stripe 710-*a*1, 710-*a*2, 710-*a*3 through 710-*aq* has four data blocks 706.

Note that in the examples of FIGS. 7, 7B, and 7C, the chunk size is consistent from one redundancy coding stripe to the next. However, it is possible for the chunk size in redundancy coding stripe 710 to be different from the chunk size in another redundancy coding stripe 710 (even if the chunks are stored in the same erase block).

In one embodiment, the same group of offsets 716 on each storage device 120 are used for each particular redundancy coding stripe 710. Thus, the chunk size is not limited to the examples in FIGS. 7, 7B, and 7C.

Figure 8:
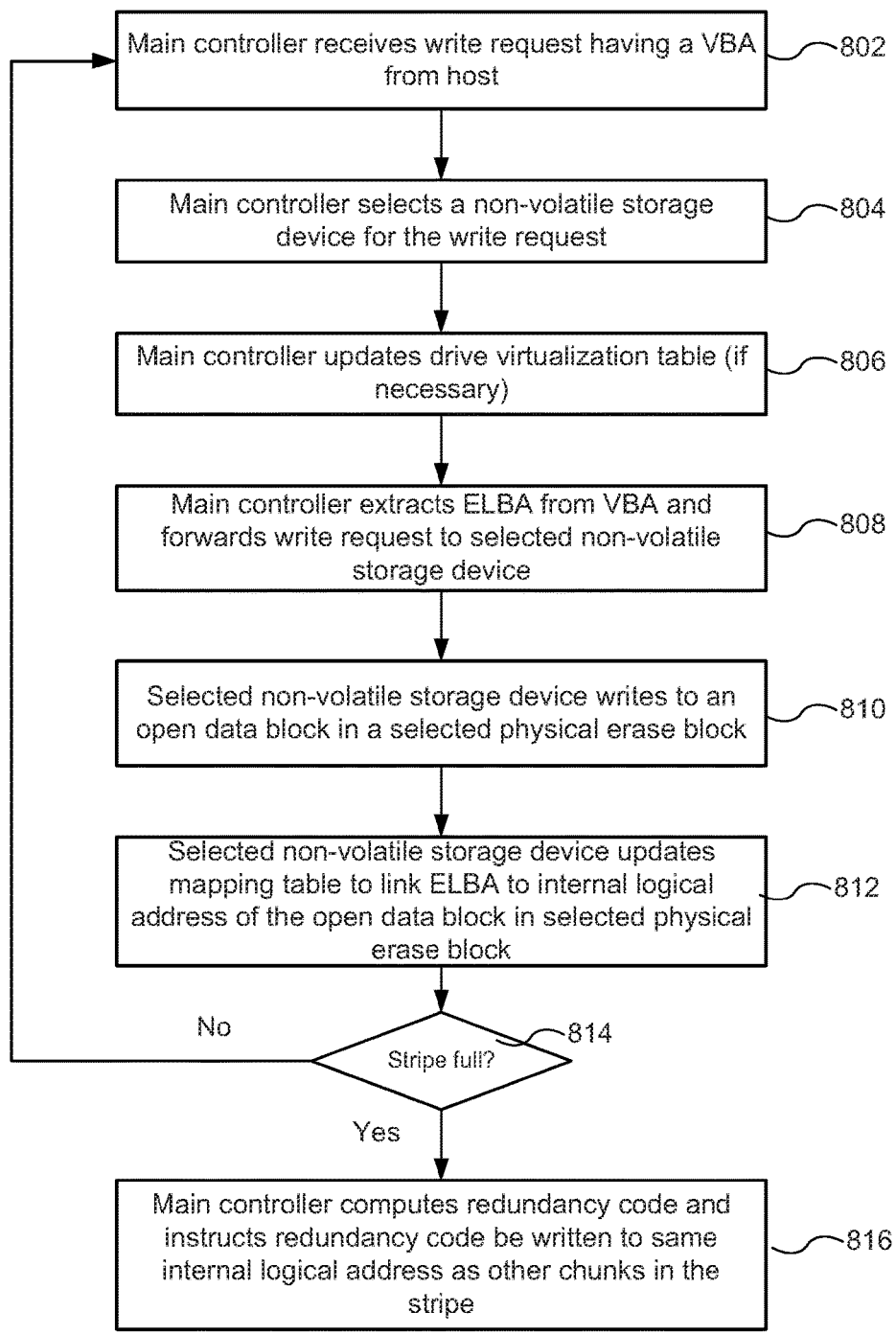
FIG. 8 is a flowchart of one embodiment of a process of writing a redundancy stripe to non-volatile storage devices.

FIG. 8 is a flowchart of one embodiment of a process 800 of writing a redundancy stripe to non-volatile storage devices 120. In process 800, the various chunks of the stripe are written to the same internal address in the non-volatile storage devices. Process 800 is one embodiment of forming a redundancy coding stripe from chunks of data having internal addresses assigned in a coordinated external logical address to internal address translation scheme across the storage devices. Reference will be made to the system 700 of FIG. 7 for purpose of illustration; however, process 800 is not limited to system 700. Some steps of process 800 may be performed by the main controller 130, whereas others may be performed by storage devices 120. Note that all or a portion of the main controller 130 could be external to the storage devices 120. However, all of a portion of the main controller 130 could be inside one or more of the storage devices 120. In addition, in certain embodiments, the functions of the main controller 130 can be performed by a host system. In that case, where FIG. 8 indicates a main controller function, that function can be performed by the host system.

For the sake of illustration process 800 will be discussed with respect to an example in which two non-volatile storage devices 120 are used to store data from the host, and one non-volatile storage devices 120 is used for a redundancy code (e.g., parity). For the sake of discussion, each device 120 will store one chunk of the redundancy stripe. In process 800, each storage device 120 will write its chunk to the same internal address. With reference to FIG. 7, storage devices 120-1 and 120-2 may be used to store data from the host, and one or more storage devices 120-*m* may be used to store a redundancy code (e.g., parity).

Step 802 includes the main controller 130 receiving a write request from host system 115. The write request contains a VBA, in one embodiment. The VBA has an ELBA and drive bits, in one embodiment. For the sake of illustration, the write request may be to write a chunk of data. The chunk could be any size, such as, for example, 512 bytes, 1 KB, 2 KB, 4 KB, 16 KB, etc. In one embodiment, the chunk is to write one or more pages. However, the chunk is not required to equal an integral number of pages. The data itself need not be provided in the write request. Instead the write request may contain a descriptor that indicates the location of the data in, for example, host memory. In one embodiment, the chunk corresponds to the size of one data block 706. In the case where the host system 115 is performing the functions of the main controller, this may be an optional step.

Step 804 includes the main controller 130 selecting a non-volatile storage device 120 to send the write request to. Step 804 may include the main controller 130 accessing the drive virtualization data structure 734. Note that the drive virtualization data structure 734 may store a VBA to storage device mapping. In the case where the host system 115 is performing the functions of the main controller, the drive virtualization data structure 734 may reside in the host system's memory. In one embodiment, the main controller determines whether data for the VBA has already been stored in one of the storage devices 120. If so, then the main controller may select that storage device 120 to store new data for the VBA. If data for the VBA is not stored in any of the storage devices 120, then the main controller 130 may select one of the storage devices 120. As one example, the main controller 130 might select storage device 120-1 to store one chunk of a redundancy stripe.

Step 806 includes the main controller 130 updating the DVT 734, if needed. Step 806 may be performed by the drive virtualization logic 732. In one embodiment, the action creates a link between the VBA and the non-volatile storage device 120 that was selected in step 804.

Step 808 includes the main controller 130 extracting the ELBA from the VBA and forwarding the write request to the selected non-volatile storage device 120. The main controller may modify the write request prior to forwarding it. For example, the VBA may be changed to the ELBA through, for example, shifting of certain bits to extract the ELBA from the VBA. Thus, the write request that is sent to the selected non-volatile storage device 120 contains the ELBA from the original write request having the VBA, in one embodiment. Step 808 may be performed by the drive virtualization logic 732.

Step 810 includes the selected non-volatile storage device writing the data to an open data block 706 in a selected physical erase block 714. The physical erase block 714 may have been selected because the selected non-volatile storage device is in the process of filling the selected physical erase block 714 with data. For example, if the non-volatile storage device receives a number of random writes at about the same time, the non-volatile storage device may fill the selected physical erase block 714 sequentially with the random writes. For example, the data blocks 706 are written in order of their physical addresses, in one embodiment. Thus, the open data block may simply be the next data block 706 in the sequence of physical data block addresses. Note that the physical erase block 714 may be associated with a virtual erase block address, which together with the offset, make up the ILBA. However, as further explained below, some level of coordination is performed in certain embodiments to ensure the virtual erase block addresses selected for chunks within a stripe are the same across the respective storage devices that store the chunks. Step 810 may be performed by various elements including, but not limited to, one or more of state machine 112, on-chip address decoder 114, power control 116, processor 122*c*, read/write circuits 128, decoders 124, 132.

Step 812 includes the selected non-volatile storage device updating the ELBA to ILBA mapping structure 750 such that the ELBA is mapped to the ILBA. For example, the ELBA may be mapped to an ILBA including a virtual erase block address 704 and an offset 716. As noted above, the physical erase block 714 may have been associated with a virtual erase block address. The offset 716 may be dictated by the physical data block address. For example, referring to FIG. 7A, if the data was written to physical data block address 706-2, this may correspond to offset 716-2. Step 812 may be performed by address mapping module 150.

Step 814 is a determination of whether the redundancy stripe is full of data. If not, then the process returns to step 802. Here, a full stripe means full with data excluding the redundancy code (e.g., parity). The next time through the process 800, the main controller may select a different non-volatile storage device 120 to write the data to. Note that each iteration of process 800, a different non-volatile storage device 120 may write its chunk of the redundancy stripe to the same internal address. Step 814 may be performed by redundancy coding module 136. The redundancy coding module could be in the host system 115, the main controller 130, a storage device 120, or elsewhere.

Note that by each non-volatile storage device 120 writing its chunk of the redundancy stripe to the same internal address, this may result in sequential data writing at the same internal address across multiple non-volatile storage devices 120. For example, consider a case in which four different non-volatile storage devices 120 each store one chunk of data in the redundancy coding stripe. Also, consider the ELBAs (within the VBAs) received at the main controller in step 802 to be random ELBAs. Each non-volatile storage devices 120 may store data for one of four random ELBAs that were received sequentially in time by the main controller. Moreover, these four random ELBAs that were received sequentially in time by the main controller may be stored at the same internal address across multiple non-volatile storage devices 120, due to the non-volatile storage devices 120 serializing these ELBAs to the same internal addresses in a coordinated fashion.

When the stripe is full, the main controller 130 computes a redundancy code (e.g., parity) and instructs that redundancy code be written to the same internal address of the internal addresses of the other chunks in the stripe, in step 816. Note that the main controller 130 may instruct a different storage device 120 than was already used. Step 816 is one embodiment of instructing that a redundancy code be written to an internal address assigned in a coordinated external logical address to internal address translation scheme across the storage devices.

The following example will be used to illustrate further details of one embodiment of process 800. In step 802, the main controller 130 receives a request from the host 115 to write a 4 KB block of data at VBA "5." In step 804, the main controller 130 selects non-volatile storage device 120-1 to write the data. In step 806, the main controller 130 updates the drive virtualization data structure 734 such that VBA "5" points to the selected non-volatile storage device 120-1. In step 808, the main controller 130 extracts the ELBA from the VBA. In this example, the ELBA is "1," which is derived by right shifting VBA "5" in binary by two bits, assuming the two least significant bits are drive bits. The main controller 130 sends a command to non-volatile storage device 120-1 to write a block of data at ELBA 1. In one embodiment, the write may be first sent to another storage device, e.g., 120-m, that will accumulate the write for parity calculation, and that storage device may forward the write to storage device 120-1.

In step 810, non-volatile storage device 120-1 serializes the incoming write to ELBA "1" and writes a 4 KB data chunk to a physical erase block that is referenced by virtual erase block address "12." Virtual erase block address "12" is an arbitrary example. For the sake of example, the physical erase block is "367," which is just an arbitrary example. The non-volatile storage device 120-1 writes a 4 KB data chuck at the offset of "25," which is also an arbitrary example. Thus, with reference to FIG. 7, non-volatile storage device 120-1 writes a 4 KB data chunk to physical erase block 714-367 at data block 706-25.

In step 812, non-volatile storage device 120-1 updates the mapping from ELBA to ILBA. In this example, the virtual erase block address is "12" and the offset is "25". For the sake of example, there are 512 data blocks 706 per physical erase block 714. Thus, there are 512 offsets 716 per entry 704 in the erase block virtualization data structure 702. Thus, the ILBA is "6169" ((512×12)+25). ELBA "1" maps to ILBA is "6169". Step 812 may be performed by address mapping module 150.

Next, the process 800 is repeated for another write request. In step 802, the main controller 130 receives a request from the host 115 to write a 4 KB block of data at VBA "1027." In step 804, the main controller 130 selects non-volatile storage device 120-2 to write the data. In step 806, the main controller 130 updates the drive virtualization data structure such that VBA "1027" points to the selected non-volatile storage device 120-2. In step 808, the main controller 130 extracts the ELBA from the VBA. In this example, the ELBA is "256" (e.g., binary right shift by two bits (1027>>2)). The main controller 130 sends a command to non-volatile storage device 120-2 to write a block of data at ELBA "256." In one embodiment, the write may be first sent to another storage device, e.g., 120-m, that will accumulate the write for parity calculation, and that storage device may forward the write to storage device 120-2.

In step 810, non-volatile storage device 120-2 writes a 4 KB data chunk to a physical erase block that is referenced by virtual erase block address "12." Note that this is the same virtual erase block address to which non-volatile storage device 120-1 wrote its chunk of the redundancy stripe. In one embodiment, the non-volatile storage devices coordinate with each other, such that the same virtual erase block address is used across a stripe. Because a stripe contains writes that are near in time, serialized, the virtual erase block address selected can be coordinated across the storage devices accordingly. For example, the non-volatile storage devices may employ peer-to-peer communication. In one embodiment, the main controller 130 assists the coordination. For the sake of example, the physical erase block is "647," which is just an arbitrary example. Note that this is not the same physical erase block to which storage device 120-1 wrote its chunk; however, writing to the same physical erase block is not precluded. The non-volatile storage device 120-2 writes a 4 KB data chunk at offset of "25," which is the same offset used by non-volatile storage device 120-1. The offset is also coordinated with storage device 120-1, as was the virtual erase block address. Thus, with reference to FIG. 7, non-volatile storage device 120-2 writes a 4 KB data chunk to physical erase block 714-647 at data block 706-25. Thus, although the two devices 120-1, 120-2 may write to different physical blocks, they write to the same internal logical address, in this embodiment. Thus, these two chunks of the redundancy stripe are written to the same internal logical address (in the two different devices 120). In one embodiment, the storage devices communicate with each other in order to write to the same internal logical address. For example, the storage devices may have peer-to-peer communication to share information with each other with respect to which internal logical address was used for writing the first chunk, and hence should be used for other chunks. In one embodiment, the first storage device to write a chunk in a redundancy stripe may inform the main controller of the internal logical address, such that the main controller may instruct the other storage devices of the internal logical address to write other chunks of the redundancy stripe. As noted above, in certain embodiments where the host system performs the function of the main controller, the coordination could be assisted by the host system 115 (e.g., the host system 115 can assist in broadcasting the internal logical address to be used).

In step 812, non-volatile storage device 120-2 updates its mapping from ELBA to ILBA. In this example, the virtual erase block address is "12" and the offset is "25". ELBA "256" maps to ILBA is "6169". Note this is the same ILBA as for the chunk wrote by non-volatile storage device 120-1. The ELBA, however, is different in this example.

Continuing with this example, the redundancy stripe is now full. Note that in this example, the chunks are one data block 706 in size. As noted above, the chunks are not required to be one data block in size. In step 816, the main controller 130 computes the redundancy code (e.g., parity) from the two chunks of data stored in devices 120-1 and 120-2. The main controller 130 instructs non-volatile storage device 120-m to store the redundancy code at ILBA "6169", which is the same ILBA as the other chunks for the redundancy stripe. Note that this may be at virtual erase block "12" and offset "25". Alternatively, as described above, the storage device 120-m may have received those writes to devices 120-1 and 120-2 and can calculate the parity and write to the same ILBA accordingly. Non-volatile storage device 120-m is free to write the chunk of redundancy code to any physical erase block, so long as that physical erase block is presently linked to virtual erase block "12", in this example. For the sake of example, non-volatile storage device 120-m writes the chunk to physical erase block 714-168 at data block 706-25. If non-volatile storage device 120-m moves the chunk to a different physical erase block, then the non-volatile storage device should update the mapping of virtual erase block "12" to the new physical erase block. Also note that non-volatile storage device 120-m may update its mapping from an ELBA to the ILBA. In one embodiment, when the main controller sends the request to write the parity chunk, it sets the ELBA to be equal to the ILBA.

Writing the all of the chunks of the redundancy stripe to the same ILBA is one embodiment of writing all of the chunks of the redundancy stripe to the same internal address. Note that writing all of the chunks of the redundancy stripe to the same ILBA is one embodiment of writing the chunks of the redundancy stripe in a coordinated external logical address to internal address translation scheme across the storage devices. It is not required that all of the chunks be written to the same ILBA. As further described below, in one embodiment, a fixed translation scheme is used, as an alternative to using the same internal address (e.g., ILBA or PBA) on each device 120.

Next, for the sake of discussion, the host sends another request to write a VBA "5." Recall that first write in this example was to VBA "5." In one embodiment, a new redundancy stripe will be formed from the chunk to be written for this write. In step 802, the main controller 130 receives a request from the host 115 to write a 4 KB block of data at VBA "5." In step 804, the main controller 130 accesses the DVT 734 to determine that VBA "5" was stored in non-volatile storage device 120-1. Thus, the main controller 130 selects non-volatile storage device 120-1 to receive the write request. There is no need to update the DVT 734 in step 806. In step 808, the main controller 130 extracts the ELBA from the VBA. In this example, the ELBA is "1." The main controller 130 sends a command to non-volatile storage device 120-1 to write a block of data at ELBA "1."

In step 810, non-volatile storage device 120-1 writes a 4 KB data chunk to a different offset from the offset that was previously used for ELBA "1." In one embodiment, the non-volatile storage device 120-1 does not over-write data blocks when new data is to be written at an ELBA. Instead, the non-volatile storage device 120-1 writes the new data to a different data block. This data block may be in the same physical erase block 714 as was previously used for ELBA "1." If this is the next random write, the non-volatile storage device 120-1 may increment the offset. Thus, instead of using offset "25", the non-volatile storage device may write at offset "26". For the sake of example, non-volatile storage device 120-1 may write a 4 KB data chunk at data block 706-26 in physical erase block 714-367. Recall that the previous write was to data block 706-25 in physical erase block 714-367 (with reference to FIG. 7).

In step 812, non-volatile storage device 120-1 updates the mapping from ELBA to ILBA. In this example, the virtual erase block address is "12" and the offset is "26". Thus, the ILBA is "6170" ((512×12)+26). Thus, ELBA "1" now maps to ILBA "6170". However, note that the data that is physically in data block 706-25 in physical erase block 714-367 remains. Thus, even though this data might not be valid in connection with ELBA "1," it can still be used in connection with its redundancy stripe. For example, were non-volatile storage device 120-2 to fail, the data in data block 706-25 in physical erase block 714-367 of device 120-1 may be used (along with the parity chunk in device 120-m) to recover a chunk of data lost from non-volatile storage device 120-2. Thus, by using the same internal address for all chunks in the redundancy stripe, the data may be recovered. After step 812 is done, the new stripe will be filled out with other ELBAs written into other storage devices, with the final parity calculated and written at step 816.

The example of composing a redundancy coding stripe from the same internal address (e.g., same ILBA) on different storage devices 120 is just one example of composing a redundancy coding stripe using internal addresses assigned in a coordinated scheme across the storage devices. In one embodiment, a redundancy coding stripe is formed from a chunk of data (on each storage devices 120) in which the internal address is assigned according to a fixed translation scheme. As noted above, a "fixed translation scheme," is an address translation scheme in which an address of a chunk of data on a particular storage device is defined based on a pre-determined mathematical relationship. For example, in a simple example with 3 storage devices (2 data+1 parity), the ILBA may be assigned relative to a base ILBA, with each device having an ILBA(device)=ILBA(base)+N(offset), where N is the index of the device. So chunks may be written to: ILBA "25" for device "0" (25+0), ILBA "26" for device "1" (25+1), and ILBA "27" for device "2" (25+2). Those skilled in the art would appreciate that there are potentially limitless possibilities in defining the mathematical relationship. The particular relationship would be chosen per the situation, with the understanding that any chosen mathematical relationship would enable address translation in a coordinated and pre-determined way across the storage devices, without requiring the use of a large mapping table either at the host or main controller level.

Up to this point, the examples shown have discussed using the configuration as shown in FIG. 7 to achieve the translation in various embodiments. To extend the concept in another direction, in one embodiment, a redundancy coding stripe is formed from a chunk of data (on each storage devices 120) in which the internal address is assigned according to one or more lookup tables inside of each of the plurality of non-volatile storage devices. The lookup tables can incorporate a fixed translation relationship from one address to another. In one embodiment, the erase block virtualization structure 702 is used as the lookup table, incorporating, for example, the simple offset relationship noted above. In another embodiment, one or more additional lookup tables may be added between the erase block virtualization structure 702 and final the physical addresses to which the blocks are written. For example, the address obtained as a result of looking up the erase block virtualization structure 702 may be fed to another table for lookup, to obtain another translated address. This means that the coordinated address translation scheme of various embodiments include implementations where translation is done progressively in a series of tiered table lookups. This can be done regardless of the number of tables used internal to the storage device as long as the ILBAs of the chunks in the stripes can be recovered without the use of an overall mapping table in the main controller or the host.

FIG. 9 is a flowchart of one embodiment of a process 900 of recovering lost data for an ELBA using chunks in a redundancy stripe 710. In one embodiment, process 900 is performed by redundancy coding module 136 in main controller 130. In one embodiment, process 900 is used when process 400 was used to compose redundancy coding stripes. Process 900 is one embodiment of step 408 of process 400. In one embodiment, process 900 is used when process 800 was used to compose redundancy coding stripes from chunks have the same internal address on each storage device 120.

Process 900 describes a technique to recover lost data associated with one ELBA. The process 900 may be repeated for other ELBAs, if desired. Process 900 will be discussed with reference to the example of writing data associated with ELBA "5" and "256" in connection with process 800. For the sake of example, storage device 120-2 was unable to read the data associated with ELBA "256." For the sake of example, this occurs at a time after storage device 120-1 has received the second write for ELBA "5."

Step 902 includes accessing an ILBA associated with ELBA "256." In one embodiment, the main controller 130 requests that one of the non-volatile storage devices 120 provide the ILBA to which ELBA "256" maps. In the event that non-volatile storage device 120-2 is able to access its ELBA to ILBA mapping data structure 750, then non-volatile storage device 120-2 may return the ILBA. In this example, non-volatile storage device 120-2 will return "6169." Note that this ILBA in effect identifies the redundancy coding stripe, as all non-volatile storage devices 120 used ILBA for a given redundancy coding stripe, in one embodiment.

Note that is it possible that non-volatile storage device 120-2 may be unable to access its ELBA to ILBA mapping data structure 750. In one embodiment, at least one of the other non-volatile storage devices 120 maintains a copy of the ELBA to ILBA mapping data structure 750 of non-volatile storage device 120-2. This copy may be maintained in non-volatile memory cells in the memory structure 126. Thus, the main controller 130 may obtain the ILBA from a different non-volatile storage device 120. Likewise, at least one of the other non-volatile storage devices 120 maintains a copy of the ELBA to ILBA mapping data structure 750 of non-volatile storage device 120-1, in the event non-volatile storage device 120-1 fails. The same applies to ELBA to ILBA mapping data structures 750 of other non-volatile storage devices 120.

Step 904 includes accessing a chunk of the redundancy stripe from each remaining storage device 120. In the present example, the main controller 130 requests this chunk from storage devices 120-1 and 120-m. In one embodiment, the main controller 130 sends a request for a chunk of data at the same ILBA that was provided by the failing storage device 120-2. In the present example, the main controller 130 requests a chunk of data stored at ILBA "6169." Note that this access bypasses a typical step where the controller first sends ELBA to the storage device which translates internally to an ILBA. The controller, by virtue of knowing the ILBA is the same across all devices within the stripe, in one embodiment, is able to directly make a read request at the ILBA to all the storage devices that contribute to the stripe. As already discussed, the ILBA is not required to be the same across all devices within the stripe, in all embodiments. In one embodiment of step 904, the main controller 130 sends a request for a chunk of data at an ILBA that is determined according to a fixed translation scheme.

Step 906 includes the surviving storage devices (e.g., 120-1 and 120-m) accessing mapping data structures to access data at ILBA "6169." In the present example, storage device 120-1 determines that ILBA "6169" maps to physical erase block 714-367 at data block 706-25. Note that this corresponds to the data that storage device 120-1 first wrote in connection with ELBA 1. In the present example, storage device 120-m determines that ILBA "6169" maps to physical erase block 714-168 at data block 706-25. Thus, storage device 120-1 returns the data at physical erase block 714-367 at data block 706-25, and storage device 120-1 returns the parity data at physical erase block 714-168 at data block 706-25.

Step 908 includes computing the lost data from the data chunks returned in step 906.

Step 910 includes restoring the lost data. The data might be restored to storage devices 120-2, or restored to some other storage device 120.

It is noted, in certain embodiments, since erase blocks from multiple storage devices are combined into stripes, after a garbage collection action, the parity on the affected stripes should be rebuilt. Hence, garbage collection in one embodiment is performed in a coordinated fashion among the storage devices. For example, it can be done by the host system or the main controller in a coordinated fashion. In another example, the choice of stripes (and by extension, the erase blocks) to garbage collect needs to be coordinated among the storage devices.

In addition, a storage device with in-drive RAID configuration can be used in the system embodiments as disclosed, but the in-drive RAID could potentially be superseded, freeing up the parity blocks used in in-drive RAID for storage capacity or overprovisioning.

In one embodiment, the system RAID/erasure coding encoding scheme described above is not used, i.e., no storage device 120 is assigned as the parity drive. In that embodiment, the address mapping mechanisms described above remain the same, with the exception of the omission of parity calculation and storage functions. The advantages of off-loading the write serialization to the individual storage devices are still achieved, most notably the reduced mapping table memory requirement at the host/system level. Redundancy in that case is provided by some other method, e.g. by external mirroring.

Figure 10:
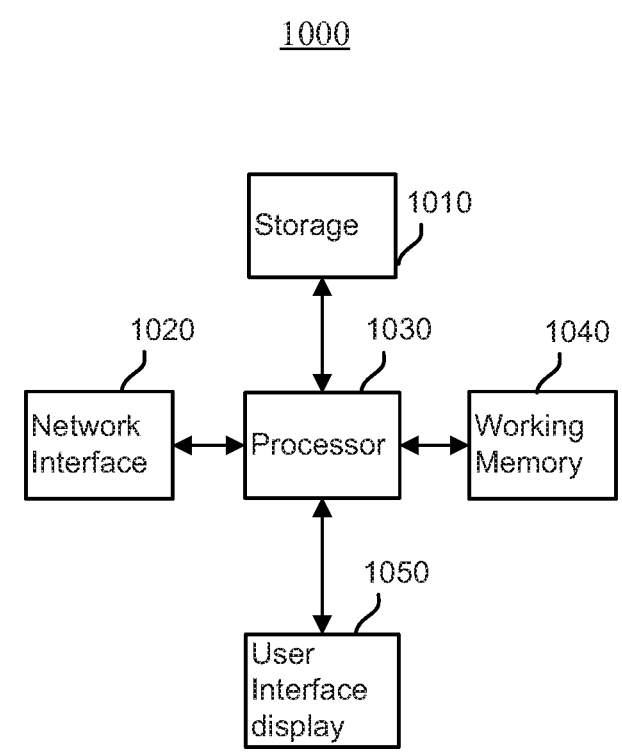
FIG. 10 illustrates a schematic diagram of a computer system.

FIG. 10 illustrates a schematic diagram of a computer system 1000 that may be used to implement one embodiment of host 115, main controller 130, or host/main controller 600. The computing system 1000 includes a storage device 1010 such as a hard disk or portable media, a network interface 1020 for communicating with other computing systems, a processor 1030 for executing software instructions, a working memory 1040 such as RAM for storing the software instructions after they are loaded from the storage device 1010, for instance, and a user interface display 1050 such as one or more video monitors. The processor 1090 may be implemented as one or more CPU chips, cores (e.g., a multi-core processor), FPGAs, ASICs, and/or DSPs, and/or may be part of one or more ASICs. A user interface can be provided as one or more monitors. The storage device 1010 and working memory 1040 may be considered to be a tangible, non-transitory processor- or computer-readable storage device having processor readable code embodied thereon for programming the processor 1030 to perform methods for providing the functionality discussed herein. The user interface display 1050 can use any known display scheme, whether graphical, tabular or the like. In addition to an on-screen display, an output such as a hard copy such from a printer can be provided.

A first embodiment disclosed herein includes a system comprising: a plurality of non-volatile storage devices. Each non-volatile storage device may comprise a plurality of non-volatile memory cells, non-transitory storage, and a communication interface configured to receive write requests to store data in non-volatile memory cells of the non-volatile storage device. One of the write requests may comprise an external logical address. Each non-volatile storage devices may further comprise mapping logic configured to store, in the non-transitory storage, a mapping between the external logical addresses in the write requests to internal addresses of the non-volatile storage device. The non-volatile storage system may further comprise redundancy coding logic configured to compose redundancy coding stripes. Each of the redundancy coding stripes may be formed from a chunk of data on each of the plurality of non-volatile storage devices. Each of the redundancy coding stripes may be formed from chunks of data having internal addresses assigned in a coordinated external logical address to internal address translation scheme across the storage devices.

In a second embodiment, and in accordance with the first embodiment, to compose the redundancy coding stripes from chunks of data having internal addresses assigned in the coordinated external logical address to internal address translation scheme, the redundancy coding logic is further configured to form redundancy coding stripes from chunks of data having the same internal address.

In a third embodiment, and in accordance with the first embodiment, to compose the redundancy coding stripes from chunks of data having internal addresses assigned in the coordinated external logical address to internal address translation scheme, the redundancy coding logic is further configured to form redundancy coding stripes from chunks of data having internal addresses assigned according to a fixed address translation scheme.

In a fourth embodiment, and in accordance with the first embodiment, to compose the redundancy coding stripes from chunks of data having internal addresses assigned in the coordinated external logical address to internal address translation scheme, the redundancy coding logic is further configured to form redundancy coding stripes from chunks of data having internal addresses assigned according to one or more lookup tables inside of each of the plurality of non-volatile storage devices.

In a fifth embodiment, and in accordance with any of the first to fourth embodiments, the non-volatile storage system further comprises recovery logic configured to recover a chunk of data that was stored in a redundancy coding stripe in one of the non-volatile storage devices based on the stored mapping between the external logical addresses to the internal addresses.

In a sixth embodiment, and in accordance with the fifth embodiment, the recovery logic is further configured to: access an internal address at which a first of the plurality of non-volatile storage devices stored a chunk of data associated with a first of the external logical addresses; access a chunk of data from other ones of the plurality of non-volatile storage devices at the same internal address at which the first non-volatile storage device stored the chunk of data associated with the first external logical address; and recover the chunk of data associated with the first external logical address based on the chunks of data from other non-volatile storages.

In a seventh embodiment, and in accordance with any of the first to sixth embodiments the system for comprises logic configured to coordinate writing of data associated with random external logical addresses in write requests that are received sequentially in time to the internal addresses assigned in the coordinated external logical address to internal address translation scheme in ones of the plurality of non-volatile storage devices.

In an eighth embodiment, and in accordance with the seventh embodiment, the redundancy coding logic is further configured to form a redundancy coding stripe from chunks of data associated with the random external logical addresses in the write requests that are received sequentially in time.

In a ninth embodiment, and in accordance with any of the first to eighth embodiments the non-volatile storage system further comprises drive virtualization logic configured to: receive write requests that each comprise a virtual address having an external logical address and at least one additional bit; and for ones of the write requests that comprise a virtual address, send a write request to a selected non-volatile storage device that instructs the selected non-volatile storage device to write data associated with the external logical address in the virtual address.

In a tenth embodiment, and in accordance with the ninth embodiment, the drive virtualization logic is further configured to maintain a drive virtualization data structure in non-transitory storage, the drive virtualization data structure indicating the selected non-volatile storage device to which a write request was sent for each of the virtual addresses.

In an eleventh embodiment, and in accordance with any of the first to tenth embodiments wherein to compose the redundancy coding stripes the redundancy coding logic is further configured to: compute a redundancy code for each redundancy coding stripe from host data; and instruct the plurality of non-volatile storage devices to write the host data and the redundancy code for redundancy coding stripe at the internal addresses assigned in the coordinated external logical address to internal address translation scheme.

In a twelfth embodiment, and in accordance with any of the first to eleventh embodiments the system comprises a data storage system having a controller and the plurality of non-volatile storage devices. The redundancy coding logic resides in the controller.

In a thirteenth embodiment, and in accordance with any of the first to twelfth embodiments the system comprises a host system communicatively coupled to the plurality of non-volatile storage devices. The redundancy coding logic resides in the host system.

One embodiment includes a method comprising receiving, at each of a plurality of non-volatile storage devices, a plurality of write requests that each comprise an external logical address. The plurality of non-volatile storage devices sharing a common internal logical addressing scheme. The method further comprises mapping, at each of the plurality of non-volatile storage devices, the external logical addresses to internal logical addresses in the common internal logical addressing scheme. The method further comprises storing the mapping in non-transitory storage in ones of the plurality of non-volatile storage devices. The method further comprises composing redundancy coding stripes by a master controller. Each of the redundancy coding stripes is formed from a chunk of data on each of the plurality of non-volatile storage devices. Each of the redundancy coding stripes formed from data having the same internal logical address in the common internal logical addressing scheme.

One embodiment includes a method comprising receiving, at each of a plurality of non-volatile storage devices, a plurality of write requests that each comprise an external logical address. The plurality of non-volatile storage devices sharing a common internal logical addressing scheme. The method further comprises mapping, at each of the plurality of non-volatile storage devices, the external logical addresses to internal logical addresses in the common internal logical addressing scheme. The method further comprises storing the mapping in non-transitory storage in ones of the plurality of non-volatile storage devices. The method further comprises composing redundancy coding stripes by a master controller. Each of the redundancy coding stripes is formed from a chunk of data on each of the plurality of non-volatile storage devices. Each of the redundancy coding stripes formed chunks of data having internal addresses assigned in a coordinated external logical address to internal address translation scheme across the storage devices.

One embodiment includes a non-volatile storage system comprising: redundancy coding means for composing redundancy coding stripes, the redundancy coding means further for sending write requests to a plurality of non-volatile storage devices to each write a chunk of data of a redundancy coding stripe at the same internal address, each of the write requests having an external logical address; communication means for receiving the write requests at the plurality of non-volatile storage devices; writing means for writing chunks of a redundancy stripe having internal addresses assigned in a coordinated external logical address to internal address translation scheme across the storage devices; and address mapping means for mapping the external logical addresses in the write requests to internal addresses of the plurality of non-volatile storage devices, the mapping means further for storing the mapping in non-transitory storage.

One embodiment includes a non-volatile storage system comprising: redundancy coding means for composing redundancy coding stripes, the redundancy coding means further for sending write requests to a plurality of non-volatile storage devices to each write a chunk of data of a redundancy coding stripe at the same internal address, each of the write requests having an external logical address; communication means for receiving the write requests at the plurality of non-volatile storage devices; writing means for writing chunks of a redundancy stripe at the same internal address on each of the plurality of non-volatile storage devices; and address mapping means for mapping the external logical addresses in the write requests to internal addresses of the plurality of non-volatile storage devices, the mapping means further for storing the mapping in non-transitory storage.

In one embodiment, the redundancy coding means includes one or more of redundancy coding module 136, processor 122c, CPUs 200, drive virtualization logic 732, but is not limited thereto.

In one embodiment, the communication means includes one or more of interface 122d, front end module 208, host interface 220, PHY 222, but is not limited thereto.

In one embodiment, the writing means includes one or more of processor 122c, CPUs 200, state machine 112, on-chip address decoder 114, power control 116, read/write circuits 128, decoders 124, 132, but is not limited thereto.

In one embodiment, the address mapping means includes one or more of address mapping module 150, processor 122c, CPUs 200, state machine 112, power control 116, read/write circuits 128, but is not limited thereto.

In one embodiment, the non-volatile storage system further comprises data recovery means for recovering a chunk of data that was stored in a redundancy coding stripe in one of the non-volatile storage devices based on the stored mapping of the external logical addresses to the internal addresses. The data recovery means may include one or more of redundancy coding module 136, address mapping module 150, processor 122c, CPUs 200, state machine 112, power control 116, on-chip address decoder 114, read/write circuits 128, decoders 124, 132, but is not limited thereto.

Numerous details are described herein to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A system comprising:
   a plurality of non-volatile storage devices, each non-volatile storage device comprising:
      a plurality of non-volatile memory cells;
      a non-transitory storage;
      a communication interface configured to receive write requests to store data in non-volatile memory cells of the non-volatile storage device, ones of the write requests comprising an external logical address;
      a mapping logic configured to store, in the non-transitory storage, a map between external logical addresses in the write requests and internal addresses of the non-volatile storage device; and
      a redundancy coding logic configured to compose redundancy coding stripes, each of the redundancy coding stripes formed from a chunk of data on each of the plurality of non-volatile storage devices, the chunk of data on each of the plurality of non-volatile storage devices having an internal address assigned by the mapping logic using an external logical address to internal address translation scheme that coordinates a serialization of the external logical addresses to the internal addresses across the plurality of storage devices.

2. The system of claim 1, wherein to compose the redundancy coding stripes, the redundancy coding logic is further configured to:
   form redundancy coding stripes from chunks of data having the same internal address.

3. The system of claim 1, wherein to compose the redundancy coding stripes, the redundancy coding logic is further configured to:
   form redundancy coding stripes from chunks of data having internal addresses assigned according to a fixed address translation scheme.

4. The system of claim 1, wherein to compose the redundancy coding stripes, the redundancy coding logic is further configured to:
   form redundancy coding stripes from chunks of data having internal addresses assigned according to one or more lookup tables inside of each of the plurality of non-volatile storage devices.

5. The system of claim 1, further comprising a recovery logic configured to:
   recover a chunk of data that was stored in a redundancy coding stripe in one of the non-volatile storage devices based on the stored map between the external logical addresses and the internal addresses.

6. The system of claim 5, wherein the recovery logic is further configured to:
   access an internal address at which a first of the plurality of non-volatile storage devices stored a chunk of data associated with a first of the external logical addresses;
   access a chunk of data from other ones of the plurality of non-volatile storage devices at the same internal address at which the first non-volatile storage device stored the chunk of data associated with the first external logical address; and
   recover the chunk of data associated with the first external logical address based on the chunks of data from other non-volatile storages.

7. The system of claim 1, further comprising a logic configured to coordinate writing of data associated with random external logical addresses in write requests that are received sequentially in time to the internal addresses assigned in a coordinated external logical address to internal address translation scheme in ones of the plurality of non-volatile storage devices.

8. The system of claim 7, wherein the redundancy coding logic is further configured to form a redundancy coding stripe from chunks of data associated with the random external logical addresses in the write requests that are received sequentially in time.

9. The system of claim 1, further comprising a drive virtualization logic configured to:
   receive write requests that each comprise a virtual address having an external logical address and at least one additional bit; and
   for ones of the write requests that comprise a virtual address, send a write request to a selected non-volatile storage device that instructs the selected non-volatile storage device to write data associated with the external logical address in the virtual address.

10. The system of claim 9, wherein the drive virtualization logic is further configured to:
    maintain a drive virtualization data structure in non-transitory storage, the drive virtualization data structure indicating the selected non-volatile storage device to which a write request was sent for each of the virtual addresses.

11. The system of claim 1, wherein to compose the redundancy coding stripes, the redundancy coding logic is further configured to:
    compute a redundancy code for each redundancy coding stripe from host data; and instruct the plurality of non-volatile storage devices to write the host data and the redundancy code for redundancy coding stripe at the internal addresses assigned using the external logical address to internal address translation scheme.

12. The system of claim 1, further comprising a controller, wherein the redundancy coding logic resides in the controller.

13. The system of claim 1, further comprising a host system communicatively coupled to the plurality of non-volatile storage devices, wherein the redundancy coding logic resides in the host system.

14. A method comprising:
receiving, at each of a plurality of non-volatile storage devices, a plurality of write requests that each comprise an external logical address, the plurality of non-volatile storage devices sharing a common internal logical addressing scheme;
mapping, at each of the plurality of non-volatile storage devices, a map between the external logical addresses and internal logical addresses in the common internal logical addressing scheme;
storing the map in non-transitory storage in ones of the plurality of non-volatile storage devices; and
composing redundancy coding stripes by a master controller, each of the redundancy coding stripes formed from a chunk of data on each of the plurality of non-volatile storage devices, the chunk of data on each of the plurality of non-volatile storage devices having the same internal logical address in the common internal logical addressing scheme that serializes the external logical addresses to the internal addresses across the plurality of non-volatile storage devices.

15. The method of claim 14, further comprising:
recovering a chunk of data that was stored in a redundancy coding stripe in one of the non-volatile storage devices based on the stored map between the external logical addresses and the internal logical addresses.

16. The method of claim 15, wherein recovering the chunk of data further comprises:
accessing an internal logical address at which a first of the plurality of non-volatile storage devices stored a chunk of data associated with a first of the external logical addresses;
accessing a chunk of data from other of the plurality of non-volatile storages at the same internal logical address at which the first non-volatile storage device stored the data associated with the first external logical address; and
recovering the chunk of data associated with the first external logical address based on the chunks of data from other non-volatile storage devices.

17. The method of claim 14, further comprising:
writing data for random external logical addresses in write requests that are received at the master controller sequentially in time at the same internal logical address in ones of the non-volatile storage devices.

18. The method of claim 14, further comprising:
receiving, by the master controller, write requests that each comprise a virtual address that comprises an external logical address and drive bits;
selecting, by the master controller, one of the plurality of non-volatile storage devices for each of the write requests;
sending for each of the write requests that comprise a virtual address, by the master controller, a request to a selected non-volatile storage device to write data associated with the external logical address in the virtual address; and
maintaining, by the master controller, a drive virtualization data structure in non-transitory storage, the drive virtualization data structure indicating the selected non-volatile storage device to which a write request was sent for each of the virtual addresses.

19. The method of claim 14, wherein storing the map in the non-transitory storage in ones of the plurality of non-volatile storage devices further comprises:
maintaining, in the non-transitory storage in the ones of the plurality of non-volatile storage devices, a map between the external logical addresses in the write requests to a virtual erase block address and a pointer to a data block within a physical erase block; and
maintaining, in the non-transitory storage in the ones of the plurality of non-volatile storage devices, a map between a virtual erase block address and a physical erase block address for a physical erase block that presently stores valid data associated with the external logical address that is mapped to the virtual erase block address.

20. The method of claim 14, wherein composing the redundancy coding stripes further comprises:
collecting, by redundancy coding logic, enough host data from write requests from a host to fill an entire redundancy coding stripe;
computing, by the redundancy coding logic, a redundancy code for the host data in the redundancy coding stripe; and
instructing, by the redundancy coding logic, the plurality of non-volatile storage devices to write the host data and the redundancy code in the entire redundancy coding stripe at the same internal logical address.

21. The method of claim 20, wherein instructing the plurality of non-volatile storage devices to write the host data and the redundancy code in the entire redundancy coding stripe at the same internal logical address further comprises:
instructing a set of the plurality of non-volatile storage devices to each write a chunk of the data from a requestor to the same address in the common internal logical addressing scheme of the plurality of non-volatile storage devices; and
instructing at least one of the plurality of non-volatile storage devices to write a chunk of the redundancy code to the same address in the common internal logical addressing scheme of the plurality of non-volatile storage devices to which the data from the requestor was written.

22. A system comprising:
redundancy coding means for composing redundancy coding stripes, the redundancy coding means further for sending write requests to a plurality of non-volatile storage devices to write a chunk of data of a redundancy coding stripe at the same internal address on each of the plurality of non-volatile storage devices, each of the write requests having an external logical address serialized to the same internal address across the plurality of non-volatile storage devices;
communication means for receiving the write requests at the plurality of non-volatile storage devices;
writing means for writing the chunk of data of a redundancy stripe at the same internal address on each of the plurality of non-volatile storage devices; and address mapping means for mapping a map between external logical addresses in the write requests and internal addresses of the plurality of non-volatile storage devices, the address mapping means further for storing the map in non-transitory storage.

23. The system of claim 22, further comprising:
data recovery means for recovering a chunk of data that was stored in a redundancy coding stripe in one of the plurality of non-volatile storage devices based on the stored map between the external logical addresses and the internal addresses.

24. The system of claim 23, wherein the data recovery means is further for:
accessing an internal address at which a first of the plurality of non-volatile storage devices stored a chunk of data associated with a first of the external logical addresses;
accessing a chunk of data from other ones of the plurality of non-volatile storages at the same internal address at which the first non-volatile storage device stored the data associated with a first external logical address; and
recovering the chunk of data associated with the first external logical address based on the chunks of data from other non-volatile storages.

25. The system of claim 22, wherein the writing means is further for:
writing data for random external logical addresses in write requests that are received sequentially in time at ones of non-volatile storage devices at the same internal address in the ones of the non-volatile storage devices.

* * * * *